(12) United States Patent
Ashida

(10) Patent No.: US 12,273,222 B2
(45) Date of Patent: Apr. 8, 2025

(54) SEMICONDUCTOR INTEGRATED CIRCUIT AND SIGNAL PROCESSING DEVICE

(71) Applicant: Kioxia Corporation, Tokyo (JP)

(72) Inventor: Mitsuyuki Ashida, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 274 days.

(21) Appl. No.: 17/898,914

(22) Filed: Aug. 30, 2022

(65) Prior Publication Data
US 2023/0308319 A1 Sep. 28, 2023

(30) Foreign Application Priority Data

Mar. 22, 2022 (JP) ................................ 2022-045912

(51) Int. Cl.
*H04L 25/03* (2006.01)
*H03K 19/0185* (2006.01)
*H04L 25/02* (2006.01)

(52) U.S. Cl.
CPC . *H04L 25/03834* (2013.01); *H03K 19/01855* (2013.01); *H04L 25/0264* (2013.01)

(58) Field of Classification Search
CPC .......... H03K 19/01855; H04L 25/0264; H04L 25/03828; H04L 25/03834; H04L 25/0384
See application file for complete search history.

(56) References Cited

U.S. PATENT DOCUMENTS

| | | | | |
|---|---|---|---|---|
| 5,517,399 A | * | 5/1996 | Yamauchi | H02M 1/081 323/272 |
| 9,219,626 B2 | | 12/2015 | Yamaguchi | |
| 2004/0251948 A1 | * | 12/2004 | Lee | H03H 19/008 327/308 |
| 2005/0151576 A1 | | 7/2005 | Lee et al. | |
| 2010/0123945 A1 | * | 5/2010 | Kai | H03K 5/08 359/239 |

(Continued)

FOREIGN PATENT DOCUMENTS

| | | |
|---|---|---|
| JP | 2012-161039 A | 8/2012 |
| JP | 5621895 B1 | 11/2014 |
| JP | 6876735 B2 | 5/2021 |

OTHER PUBLICATIONS

C. Loi, et al., "A 400Gb/s Transceiver for PAM-4 Optical Direct-Detect Application in 16nm FinFET" ISSCC 2019, Session 6, Ultra-High-Speed Wireline 6.5, 2019 IEEE International Solid-State Circuits Conference. Feb. 18, 2019; 3 pages.

(Continued)

*Primary Examiner* — David B Lugo
(74) *Attorney, Agent, or Firm* — Foley & Lardner LLP

(57) ABSTRACT

A semiconductor integrated circuit including a waveform shaping circuit is provided. The waveform shaping circuit receives a signal. The waveform shaping circuit operates with a first inductance value in a first period. During the first period, a rising edge or a falling edge of a waveform of the signal is enhanced. The waveform shaping circuit operates with a second inductance value in a second period. During the second period, the rising or falling edges of the waveform is not enhanced. The first inductance value is larger than the second inductance value.

19 Claims, 17 Drawing Sheets

(56) References Cited

U.S. PATENT DOCUMENTS

2023/0005719 A1* 1/2023 Vicinanza ............... H01F 21/08

OTHER PUBLICATIONS

H. W. Lu, et al., "A Scalable Digitalized Buffer for Gigabit I/O" National Central University, Chung Li, Taiwan, 2National Chiao-Tung University, Hsin Chu, Taiwan, IEEE 2008 Custom Intergrated Circuits Conference (CICC), IEEE 2008; 4 pages.

J. Kim, et al., "A 224Gb/s DAC-Based PAM-4 Transmitter with 8-Tap FFE in 10nm CMOS" ISSCC 2021, Session 8, Ultra-High-Speed Wireline 8.1, 2021 IEEE International Solid-State Circuits Conference, Feb. 16, 2021 DOI: 10.1109/ISSCC42613.2021. 9365840; 3 pages.

M. Erett, et al., "A 126mW 56Gb/s NRZ Wireline Transceiver for Synchronous Short-Reach Applications in 16nm FinFET" ISSCC 2018, Session 16, Advanced Optical and Wireline Techniques 16.7, ISSCC2018-Session16.7, 2018 IEEE International Solid-State Circuits Conference, Feb. 13, 2018; 3 pages.

P. Mishra, et al., "A 112Gb/s ADC-DSP-Based PAM-4 Transceiver for Long-Reach Applications with >40dB Channel Loss in 7nm FinFET" ISSCC 2021, Session 8, Ultra-High-Speed Wireline 8.7, 2021 IEEE International Solid-State Circuits Conference, Feb. 16, 2021 DOI: 10.1109/ISSCC42613.2021.9365929; 3 pages.

* cited by examiner

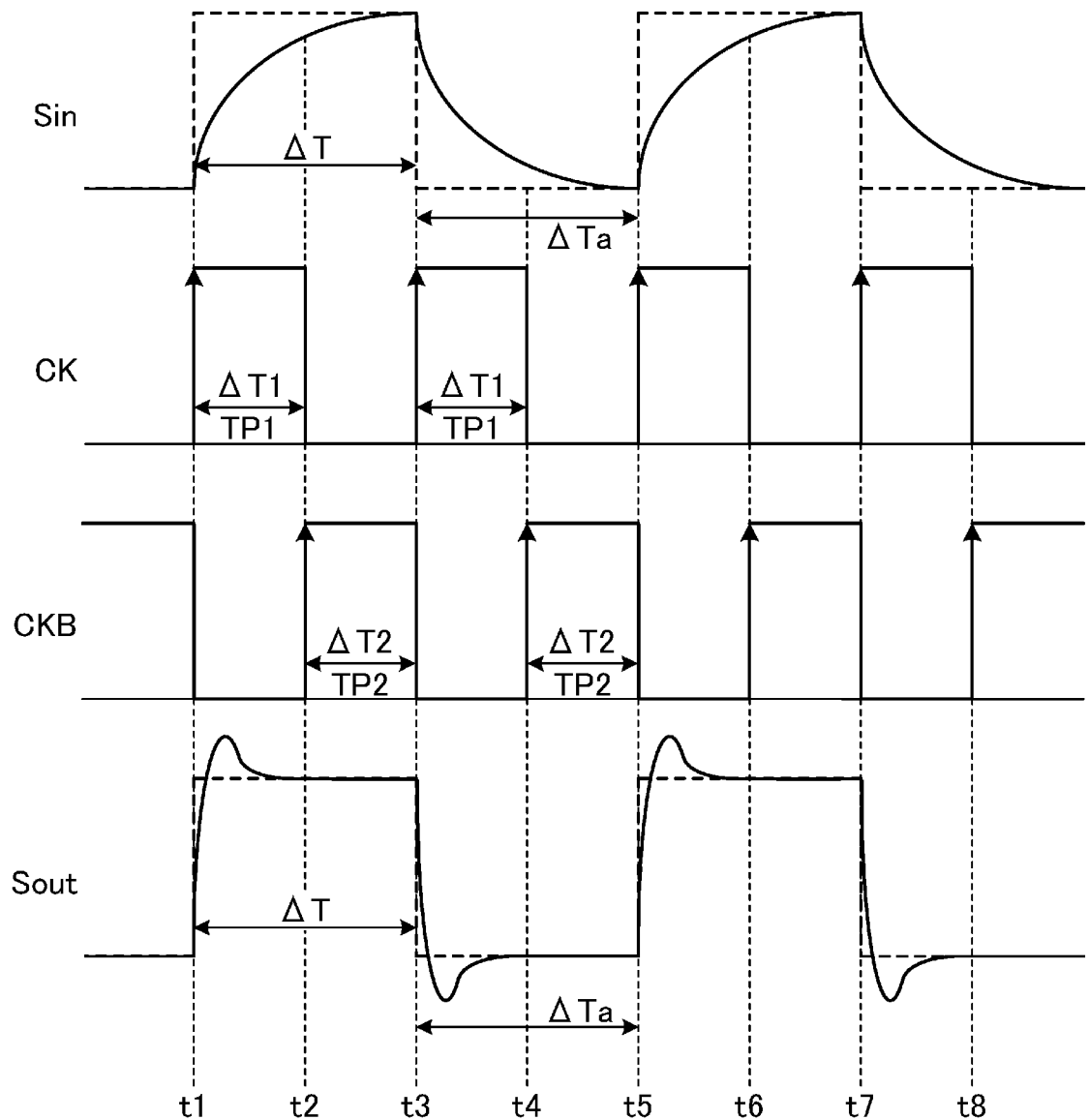

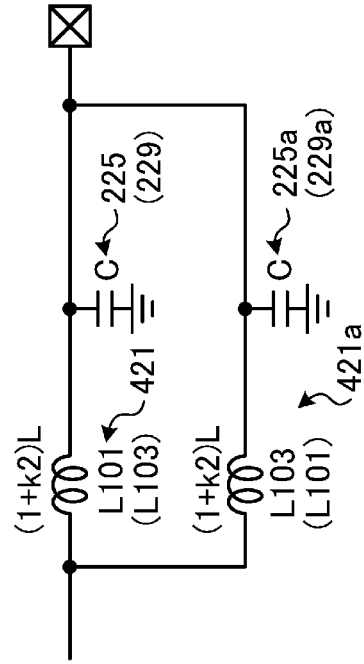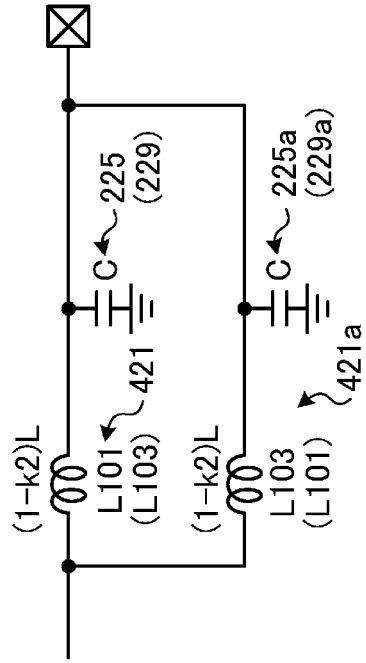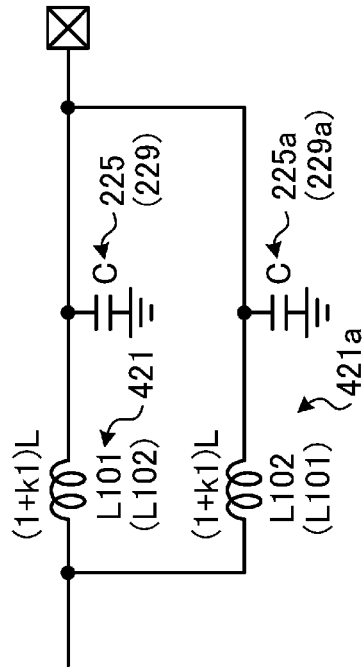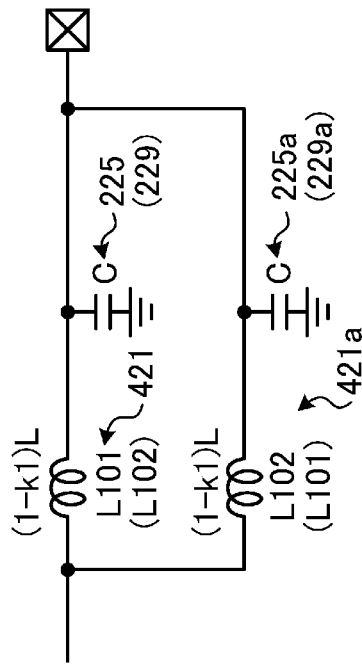

SEMICONDUCTOR INTEGRATED CIRCUIT AND SIGNAL PROCESSING DEVICE

CROSS-REFERENCE TO RELATED APPLICATION(S)

This application is based upon and claims the benefit of priority from Japanese Patent Application No. 2022-045912, filed Mar. 22, 2022, the entire contents of which are incorporated herein by reference.

FIELD

Embodiments described herein relate generally to a semiconductor integrated circuit and a signal processing device.

BACKGROUND

In a semiconductor integrated circuit including a waveform shaping circuit, a received signal may be shaped by the waveform shaping circuit. The shaped signal is used for predetermined processing. It is desired to shape a waveform of the signal with high accuracy.

DESCRIPTION OF THE DRAWINGS

FIG. 4 is a waveform diagram showing operations of the waveform shaping circuit according to at least one embodiment.

FIGS. 19A, 19B, 19C, and 19D are equivalent circuit diagrams showing operations of the waveform shaping circuit according to the fourth modification of at least one embodiment.

DETAILED DESCRIPTION

At least one embodiment provides a semiconductor integrated circuit and a signal processing device capable of shaping a waveform of a signal with high accuracy.

In general, according to at least one embodiment, a semiconductor integrated circuit including a waveform shaping circuit is provided. The waveform shaping circuit receives a signal. The waveform shaping circuit operates with a first inductance value in a first period. During the first period, a rising edge or a falling edge of a waveform of the signal is enhanced. The waveform shaping circuit operates with a second inductance value in a second period. During the second period, the rising or falling edges of the waveform is not enhanced. The first inductance value is larger than the second inductance value.

A semiconductor integrated circuit according to an embodiment will be described below in detail with reference to the accompanying drawings. The present disclosure is not limited to this embodiment.

Embodiment

Figure 1:
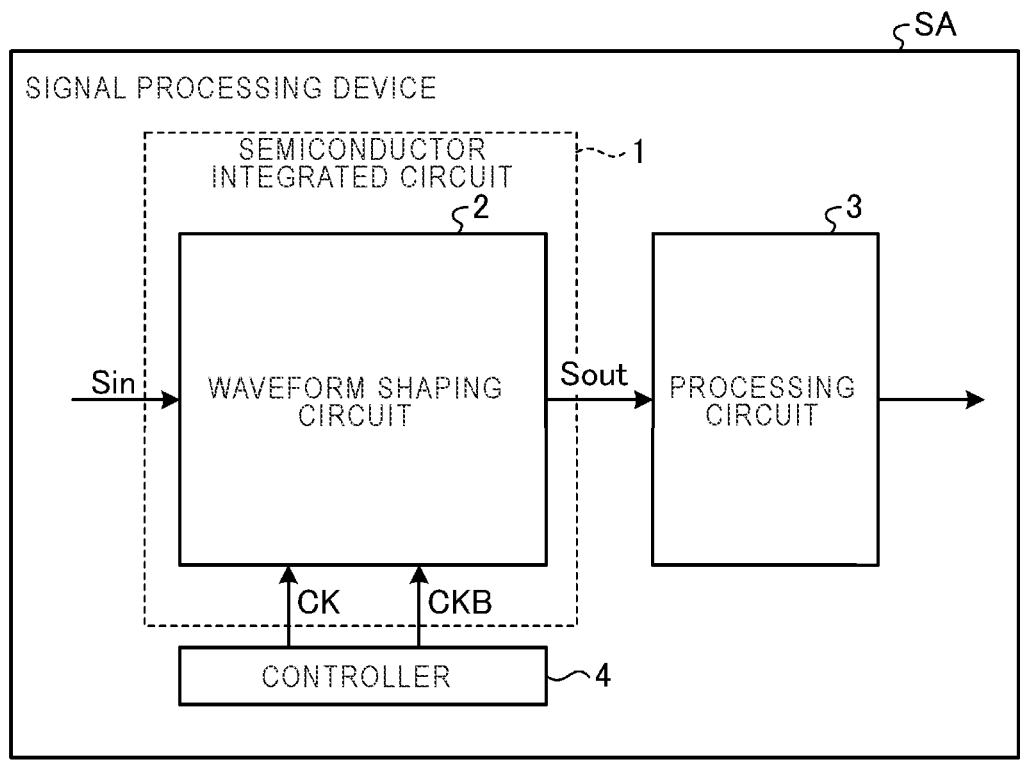
FIG. 1 is a circuit diagram showing a configuration of a signal processing device including a semiconductor integrated circuit according to at least one embodiment.

The semiconductor integrated circuit according to the embodiment includes a waveform shaping circuit and shapes a waveform of signal by the waveform shaping circuit, and is devised to prevent unwanted ringing of the signal while appropriately shaping a waveform of the signal. For example, a signal processing device SA including a semiconductor integrated circuit 1 may be configured as shown in FIG. 1. FIG. 1 is a diagram showing a configuration of the signal processing device SA including the semiconductor integrated circuit 1 according to the embodiment.

The signal processing device SA includes the semiconductor integrated circuit 1, a processing circuit 3, and a controller 4. The semiconductor integrated circuit 1 includes a waveform shaping circuit 2. The waveform shaping circuit 2 is configured to process a single-phase signal.

The waveform shaping circuit 2 receives a signal Sin from a preceding circuit thereof or an input terminal thereof, and receives control signals CK and CKB from the controller 4. The signal Sin may be a clock signal or a data signal. The control signal CKB is a signal complementary to the control signal CK, and may be a signal generated by logically inverting the control signal CK. The waveform shaping circuit 2 performs waveform shaping processing on the signal Sin in accordance with the control signals CK and CKB, and outputs a processed signal Sout to the processing circuit 3.

The waveform shaping circuit 2 is configured such that an inductance value is variable in a path through which a signal between the signal Sin and the signal Sout passes. The waveform shaping circuit 2 operates with an inductance value $L_{A1}$ in a period TP1, and operates with an inductance value $L_{A2}$ in a period TP2. The period TP1 is a period corresponding to rising or falling of a waveform of the signal Sin. The period TP2 is a period that does not correspond to the rising and the falling of the waveform of the signal Sin. The inductance value $L_{A1}$ is larger than the inductance value $L_{A2}$. The waveform shaping circuit 2 supplies the processed signal Sout regarding the inductance value to the processing circuit 3. As a result, it is possible to increase the inductance value in the period TP1 and shape the waveform with a large induced voltage, and it is possible to decrease the inductance value in the period TP2 to prevent the unwanted ringing.

Figure 2:
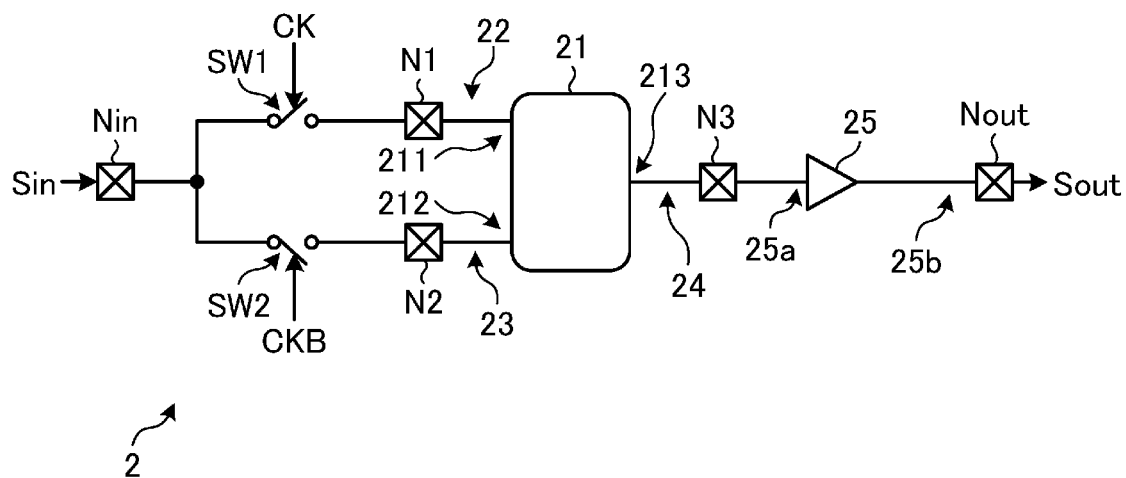
FIG. 2 is a circuit diagram showing a configuration of a waveform shaping circuit according to at least one embodiment.

The waveform shaping circuit 2 may be configured as shown in FIG. 2. FIG. 2 is a circuit diagram showing a configuration of the waveform shaping circuit 2. FIG. 2 shows a configuration in which the waveform shaping circuit 2 copes with the single-phase signal. The signals Sin and Sout shown in FIG. 2 are both single-phase signals.

The waveform shaping circuit 2 includes switches SW1 and SW2, a buffer circuit 25, and an inductive network 21.

The switch SW1 is connected between an input node Nin and a node N1. The switch SW1 has a first end connected to the input node Nin, a second end connected to the node N1, and a control terminal that receives the control signal CK. The switch SW1 includes, for example, a transistor. The switch SW1 is turned on when the control signal CK is at a H level and is turned off when the control signal CK is at an L level.

The switch SW2 is connected between the input node Nin and a node N2. The switch SW2 has a first end connected to the input node Nin, a second end connected to the node N2, and a control terminal that receives the control signal CKB. The switch SW2 includes, for example, a transistor. The switch SW2 is turned on when the control signal CKB is at an H level and is turned off when the control signal CKB is at an L level.

The buffer circuit 25 is connected between a node N3 and an output node Nout. The buffer circuit 25 includes an input node 25a connected to the node N3 and an output node 25b connected to the output node Nout. The buffer circuit 25 is, for example, a buffer amplifier, and amplifies a received signal by about one time and outputs the amplified signal.

The inductive network 21 is connected between the input node Nin and the output node Nout, and is connected between a side on which the nodes N1 and N2 are disposed and a side on which the node N3 is disposed. The inductive network 21 includes an input node 211 connected to the node N1 via a line 22, an input node 212 connected to the node N2 via a line 23, and an output node 213 connected to the node N3 via a line 24. The node N1 is connected to the input node Nin via the switch SW1. The node N2 is connected to the input node Nin via the switch SW2. The node N3 is connected to the output node Nout via the buffer circuit 25.

Figure 3A:
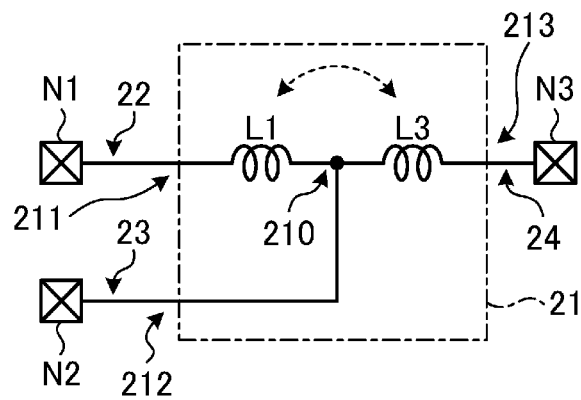
FIGS. 3A, 3B, and 3C are circuit diagrams showing configurations of an inductive network according to at least one embodiment.

The inductive network 21 includes a network of a plurality of inductive elements. An inductance value of each inductive element is variable due to a self-inductance. The inductance value of each inductive element may be variable due to mutual inductance generated by mutual coupling between the inductive elements, in addition to the self-inductance. The inductive network 21 may be configured as shown in FIG. 3A, for example. In the case of FIG. 3A, the inductive network 21 includes an inductive element L1 and an inductive element L3.

The inductive element L1 is disposed on the line 22 and is connected between the node N1 and a node 210 via the input node 211. The inductive element L1 has a first end connected to the node N1 via the input node 211 and a second end connected to the node 210. The node 210 is connected to the node N2 via the input node 212 and the line 23.

The inductive element L3 is disposed on the line 24, and is connected between the node 210 and the node N3 via the output node 213. The inductive element L3 has a first end connected to the node 210 and a second end connected to the node N3 via the output node 213.

An inductance value L3 of the inductive element L3 may be equal to an inductance value L1 of the inductive element L1, or may be smaller than the inductance value L1 of the inductive element L1. The inductive elements L1 and L3 may be configured such that an effect of mutual coupling between the inductive elements L1 and L3 does not affect the inductance values of the inductive elements L1 and L3.

Figure 3B:
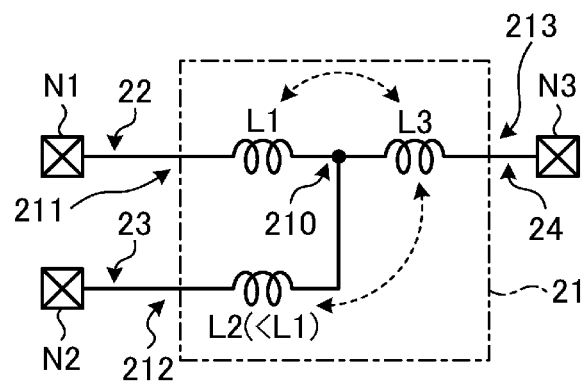

Alternatively, the inductive network 21 may include a network of a plurality of inductive elements, and may be configured as shown in FIG. 3B, for example. In the case of FIG. 3B, the inductive network 21 includes the inductive element L1, an inductive element L2, and the inductive element L3.

The inductive element L1 is disposed on the line 22 and is connected between the node N1 and the node 210 via the input node 211. The inductive element L1 has a first end connected to the node N1 via the input node 211 and a second end connected to the node 210.

The inductive element L2 is disposed on the line 23 and is connected between the node N2 and the node 210 via the input node 212. The inductive element L2 has a first end connected to the node N2 via the input node 212 and a second end connected to the node 210.

The inductive element L3 is disposed on the line 24, and is connected between the node 210 and the node N3 via the output node 213. The inductive element L3 has a first end connected to the node 210 and a second end connected to the node N3 via the output node 213.

An inductance value L2 of the inductive element L2 may be smaller than the inductance value L1 of the inductive element L1. The inductance value L3 of the inductive element L3 may be equal to the inductance value L1 of the inductive element L1, or may be smaller than the inductance value L1 of the inductive element L1. The inductive elements L1, L2, and L3 may be configured such that an effect of mutual coupling between the inductive elements L1 and L3 and between the inductive elements L2 and L3 does not affect the inductance values of the inductive elements L1, L2, and L3.

Figure 3C:
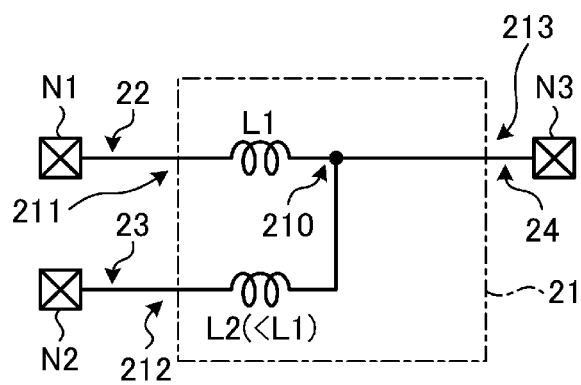

Alternatively, the inductive network 21 may include a network of a plurality of inductive elements, and may be configured as shown in FIG. 3C, for example. In the case of FIG. 3C, the inductive network 21 includes the inductive element L1 and the inductive element L2.

The inductive element L1 is disposed on the line 22 and is connected between the node N1 and the node 210 via the input node 211. The inductive element L1 has a first end connected to the node N1 via the input node 211 and a second end connected to the node 210.

The inductive element L2 is disposed on the line 23 and is connected between the node N2 and the node 210 via the input node 212. The inductive element L2 has a first end connected to the node N2 via the input node 212 and a second end connected to the node 210. The node 210 is connected to the node N3 via the output node 213 and the line 24.

The inductance value L2 of the inductive element L2 may be smaller than the inductance value L1 of the inductive element L1.

In the waveform shaping circuit 2 shown in FIG. 2, the control signal CKB is a signal complementary to the control signal CK. Each of the control signals CK and CKB is a signal that periodically varies between the H level and the L level, and a variation period thereof may be shorter than that of the signal Sin. When n is an integer of 2 or more, frequencies of the control signals CK and CKB may both be n times a frequency of the signal Sin.

Figure 5A:
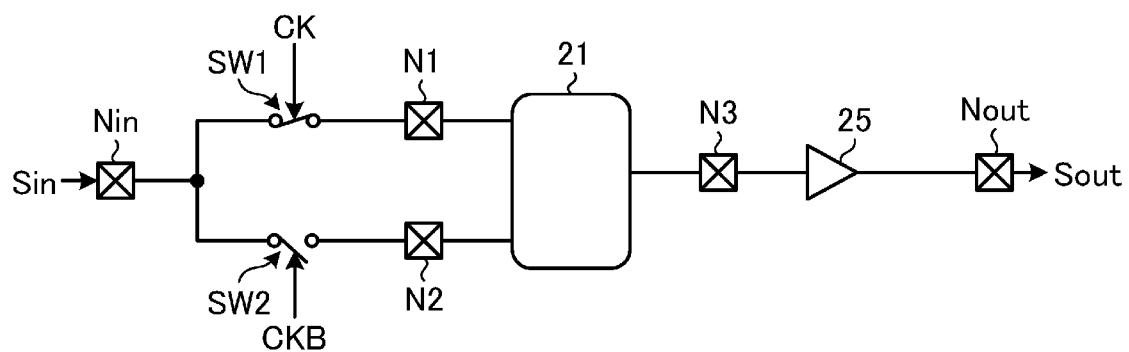
FIGS. 5A and 5B are circuit diagrams showing operations of the waveform shaping circuit according to at least one embodiment.
Figure 5B:
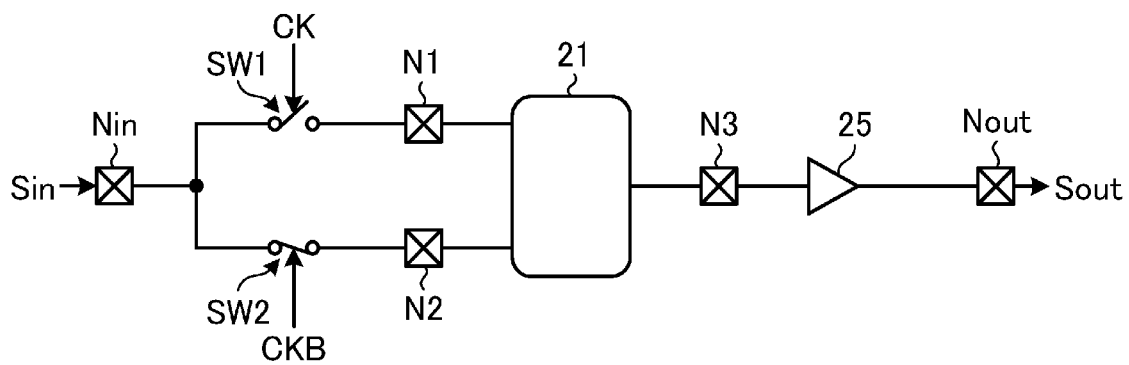

For example, when n=2, the waveform shaping circuit 2 can operate as shown in FIGS. 4, 5A, and 5B. FIG. 4 is a waveform diagram showing operations of the waveform shaping circuit 2. FIGS. 5A and 5B are circuit diagrams showing operations of the waveform shaping circuit 2.

FIG. 4 illustrates a case in which the frequencies of the control signals CK and CKB are both twice the frequency of the signal Sin. Due to an effect of a transmission line or the like, the signal Sin has a waveform in which a rising edge and a falling edge are rounded as shown by a solid line in FIG. 4 with respect to an ideal rectangular wave shown by a dotted line in FIG. 4.

The waveform shaping circuit 2 can switch a connection configuration thereof between a first mode shown in FIG. 5A and a second mode shown in FIG. 5B. The waveform shaping circuit 2 is switched to the first mode (FIG. 5A) to operate with the inductance value $L_{A1}$ in a first half period ΔT1 of a period ΔT during which the signal Sin is at an H level shown in FIG. 4, and is switched to the second mode (FIG. 5B) to operate with the inductance value $L_{A2}$ in a second half period ΔT2 of the period ΔT during which the signal Sin is at the H level. The inductance value $L_{A2}$ is smaller than the inductance value $L_{A1}$. The period ΔT1 is equivalent to a period TP1 corresponding to the rising edge of the waveform of the signal Sin. The period ΔT2 is equivalent to a period TP2 that does not correspond to the rising edge of the waveform of the signal Sin. The lengths of the period ΔT1 and the period ΔT2 may be equal to or different from each other.

The waveform shaping circuit 2 is switched to the first mode (FIG. 5A) to operate with the inductance value $L_{A1}$ in a first half period ΔT1a of a period ΔTa during which the signal Sin is at an L level shown in FIG. 4, and is switched to the second mode (FIG. 5B) to operate with the inductance value $L_{A2}$ in a second half period ΔT2a of the period ΔTa during which the signal Sin is at the L level. The period ΔT1a is equivalent to a period TP1 corresponding to the falling edge of the waveform of the signal Sin. The period ΔT2a is equivalent to a period TP2 that does not correspond to the falling edge of the waveform of the signal Sin. The lengths of the period ΔT1a and the period ΔT2a may be equal to or different from each other.

At a timing t1, the first half period ΔT1 of the period ΔT during which the signal Sin is at the H level starts. In response to a start of transition of the signal Sin from the L level to the H level, the control signal CK transitions from the L level to the H level, and the control signal CKB transitions from the H level to the L level. At the timing t1, the waveform shaping circuit 2 is switched to the first mode (FIG. 5A), the switch SW1 is turned on and maintained in the on state, and the switch SW2 is turned off and maintained in the off state.

Accordingly, for example, a current flows through a path of the node N1→the inductive element L1→the inductive element L3→the node N3 shown in FIG. 3A. As a result, an induced voltage corresponding to an inductance value $L_{A1}$=L1+L3 is generated in the inductive network 21, and a voltage at the rising edge of the signal Sin can be increased. For example, the signal Sin can be shaped into a signal S in which the rising edge of the signal Sin is overshot. The overshot signal S is amplified (for example, by about one time) by the buffer circuit 25 and is output as the signal Sout.

Alternatively, the current flows through a path of the node N1→the inductive element L1→the inductive element L3→the node N3 shown in FIG. 3B. As a result, the induced voltage corresponding to the inductance value $L_{A1}$=L1+L3 is generated in the inductive network 21, and the voltage at the rising edge of the signal Sin can be raised. For example, the signal Sin can be shaped into the signal S in which the rising edge of the signal Sin is overshot. The overshot signal S is amplified (for example, by about one time) by the buffer circuit 25 and is output as the signal Sout.

Alternatively, the current flows through a path of the node N1→the inductive element L1→the node N3 shown in FIG. 3C. As a result, an induced voltage corresponding to an inductance value $L_{A1}$=L1 is generated in the inductive network 21, and the voltage at the rising edge of the signal Sin can be increased. For example, the signal Sin can be shaped into the signal S in which the rising edge of the signal Sin is overshot. The overshot signal S is amplified (for example, by about one time) by the buffer circuit 25 and is output as the signal Sout.

At a timing t2 shown in FIG. 4, the first half period ΔT1 of the period ΔT during which the signal Sin is at the H level ends, and the second half period ΔT2 of the period ΔT during which the signal Sin is at the H level starts. In addition, the control signal CK transitions from the H level to the L level, and the control signal CKB transitions from the L level to the H level. At the timing t2, the waveform shaping circuit 2 is switched to the second mode (FIG. 5B), the switch SW1 is turned off and maintained in the off state, and the switch SW2 is turned on and maintained in the on state.

Accordingly, for example, the current flows through a path of the node N2→the inductive element L3→the node N3 shown in FIG. 3A. As a result, an inductance value of the inductive network 21 can be reduced to $L_{A2}$=L3 (<L1+L3), and the unwanted ringing of the signal S can be prevented. The ringing occurs due to a resonance phenomenon corresponding to an inductive component and a parasitic capacitance component of the inductive element L1 and the inductive element L3. The ringing can be prevented by reducing the inductive component (that is, the inductance value).

Alternatively, the current flows through a path of the node N2→the inductive element L2→the inductive element L3→the node N3 shown in FIG. 3B. As a result, the inductance value of the inductive network 21 can be reduced to $L_{A2}$=L2+L3 (<L1+L3), and the unwanted ringing of the signal S can be prevented.

Alternatively, the current flows through a path of the node N2→the inductive element L2→the node N3 shown in FIG. 3C. As a result, the inductance value of the inductive network 21 can be reduced to $L_{A2}$=L2 (<L1), and the unwanted ringing of the signal S can be prevented.

At a timing t3 shown in FIG. 4, the first half period ΔT1a of the period ΔTa during which the signal Sin is at the L level starts. In response to a start of transition of the signal Sin from the H level to the L level, the control signal CK transitions from the L level to the H level, and the control signal CKB transitions from the H level to the L level. At the timing t3, the waveform shaping circuit 2 is switched to the first mode (FIG. 5A), the switch SW1 is turned on and maintained in the on state, and the switch SW2 is turned off and maintained in the off state.

Accordingly, as in the first half period ΔT1 of the period ΔT, for example, the current flows through the path of the node N1→the inductive element L1→the inductive element L3→the node N3 shown in FIG. 3A. As a result, the induced voltage corresponding to the inductance value $L_{A1}$=L1+L3 is generated in the inductive network 21, and a voltage at the falling edge of the signal Sin can be lowered. For example, the signal Sin can be shaped into the signal S in which the falling edge of the signal Sin is undershot. The undershot signal S is amplified (for example, by about one time) by the buffer circuit 25 and is output as the signal Sout.

Alternatively, the current flows through the path of the node N1→the inductive element L1→the inductive element L3→the node N3 shown in FIG. 3B. As a result, the induced voltage corresponding to the inductance value $L_{A1}$=L1+L3 is generated in the inductive network 21, and the voltage at the falling edge of the signal Sin can be lowered. For example, the signal Sin can be shaped into the signal S in which the falling edge of the signal Sin is undershot. The undershot signal S is amplified (for example, by about one time) by the buffer circuit 25 and is output as the signal Sout.

Alternatively, the current flows through the path of the node N1→the inductive element L1→the node N3 shown in FIG. 3C. As a result, the induced voltage corresponding to the inductance value $L_{A1}$=L1 is generated in the inductive network 21, and the voltage at the falling edge of the signal Sin can be lowered. For example, the signal Sin can be shaped into the signal S in which the falling edge of the signal Sin is undershot. The undershot signal S is amplified (for example, by about one time) by the buffer circuit 25 and is output as the signal Sout.

At a timing t4 shown in FIG. 4, the first half period ΔT1a of the period ΔTa during which the signal Sin is at the L level ends, and the second half period ΔT2a of the period ΔTa during which the signal Sin is at the L level starts. The control signal CK transitions from the H level to the L level, and the control signal CKB transitions from the L level to the H level. At the timing t4, the waveform shaping circuit 2 is switched to the second mode (FIG. 5B), the switch SW1 is turned off and maintained in the off state, and the switch SW2 is turned on and maintained in the on state.

Accordingly, as in the second half period ΔT2 of the period ΔT, for example, the current flows through the path of the node N2→the inductive element L3→the node N3 shown in FIG. 3A. As a result, the inductance value of the inductive network 21 can be reduced to $L_{A2}$=L3 (<L1+L3), and the unwanted ringing of the signal S can be prevented.

Alternatively, the current flows through the path of the node N2→the inductive element L2→the inductive element L3→the node N3 shown in FIG. 3B. As a result, the inductance value of the inductive network 21 can be reduced to $L_{A2}$=L2+L3 (<L1+L3), and the unwanted ringing of the signal S can be prevented.

Alternatively, the current flows through the path of the node N2→the inductive element L2→the node N3 shown in FIG. 3C. As a result, the inductance value of the inductive network 21 can be reduced to $L_{A2}$=L2 (<L1), and the unwanted ringing of the signal S can be prevented.

At timings t5 to t8, operations similar to those at the timings t1 to t4 are performed.

As described above, according to the embodiment, in the semiconductor integrated circuit 1, the waveform shaping circuit 2 operates with a relatively large inductance value in a period corresponding to the rising edge or the falling edge of the waveform, and operates with a relatively small inductance value in a subsequent period. As a result, the inductance value can be increased at the time of rising or falling of the waveform, the waveform can be shaped with a large induced voltage, and the inductance value can be decreased in the subsequent period to prevent ringing, so that a slew rate can be appropriately improved and jitter characteristics related to the slew rate can be improved. As a result, signal quality deterioration caused by inter symbol interference (ISI) can be appropriately compensated, and the processed signal Sout can be appropriately processed by the processing circuit 3.

For example, a case is considered in which a waveform is generated by adjusting a signal level and delay of opposite phases using an inverter chain, a transmission gate, a resistor, or the like. In this case, in order to compensate for the signal quality deterioration caused by a low slew rate of a device or the ISI, a buffer size or the number of stages is adjusted, and therefore, a current to flow is likely to increase, and power consumption is likely to increase.

On the other hand, according to at least one embodiment, in the semiconductor integrated circuit 1, the waveform shaping circuit 2 switches the inductance value used for the operations by turning on or off the switches to switch a current path so as to change the inductive elements through which the current is to flow. As a result, it is possible to appropriately shape the waveform while reducing the current flowing through the waveform shaping circuit 2.

Alternatively, a case is considered in which the frequency characteristics of a band, in which frequency characteristics rolls off, is compensated by using a passive inductor to improve the bandwidth. In this case, in order to compensate for the signal quality deterioration caused by the low slew rate of the device or the ISI, the passive element such as inductor occupies a relatively large area. Therefore, it is difficult to integrate plural passive elements within a large area as a semiconductor integrated circuit.

On the other hand, according to at least one embodiment, in the semiconductor integrated circuit 1, the waveform shaping circuit 2 switches the inductance value used for the operations by turning on or off the switches to switch the current path so as to change the inductive elements through which the current is to flow. As a result, the passive elements can be formed in a relatively small area, and can be easily integrated as a semiconductor integrated circuit.

Figure 6:
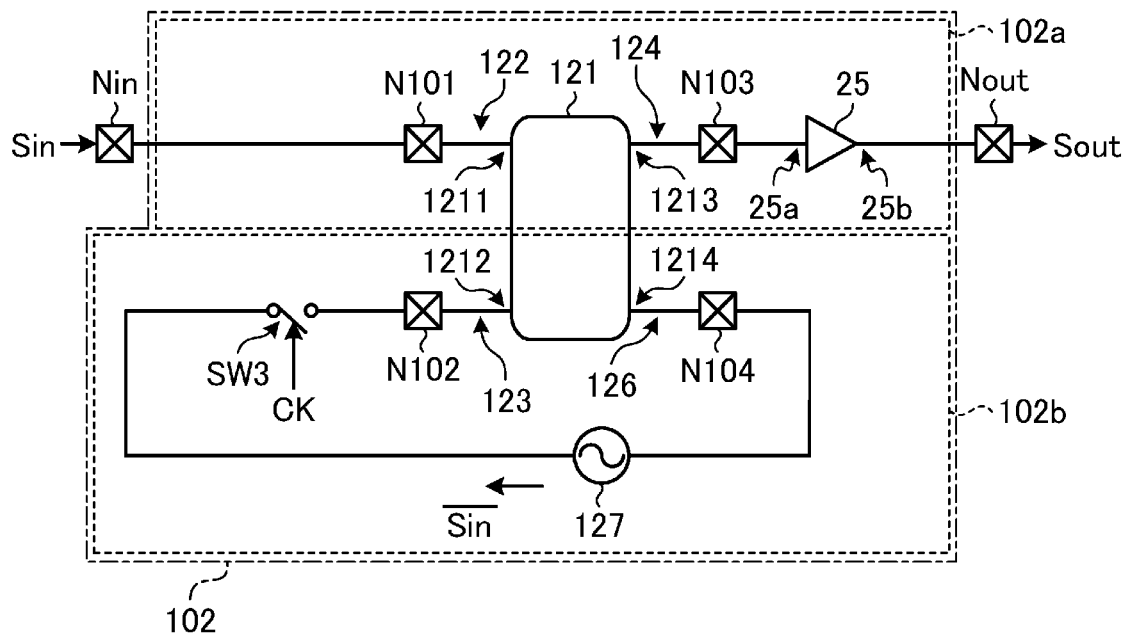
FIG. 6 is a circuit diagram showing a configuration of a waveform shaping circuit according to a first modification of at least one embodiment.
Figure 7:
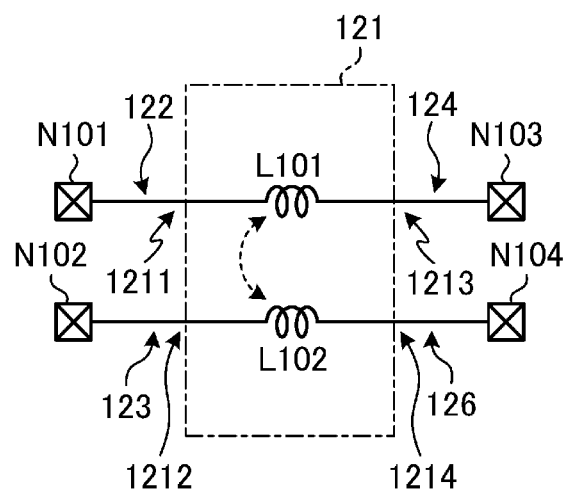
FIG. 7 is a circuit diagram showing a configuration of an inductive network according to the first modification of at least one embodiment.

As a first modification of at least one embodiment, as shown in FIGS. 6 and 7, a waveform shaping circuit 102 may include an inductive network 121. The inductive network 121 may be configured to vary an inductance value by mutual inductance between a plurality of inductive elements. The waveform shaping circuit 102 is configured to process a single-phase signal. FIG. 6 is a circuit diagram showing a configuration of the waveform shaping circuit 102 according to the first modification of the embodiment. FIG. 7 is a circuit diagram showing a configuration of the inductive network 121 according to the first modification of the embodiment.

The waveform shaping circuit 102 includes a main circuit 102a and an auxiliary circuit 102b. The main circuit 102a and the auxiliary circuit 102b share the inductive network 121. The main circuit 102a performs waveform shaping processing on the single-phase signal Sin by the inductive network 121 and outputs a processed signal Sout to a subsequent stage (for example, the processing circuit 3). The auxiliary circuit 102b assists the waveform shaping processing on the single-phase signal Sin via the inductive network 121.

The main circuit 102a includes the buffer circuit 25 and a part of the inductive network 121. The auxiliary circuit 102b includes a switch SW3, the other part of the inductive network 121, and a signal source 127. In the auxiliary circuit 102b, the switch SW3, the inductive network 121, and the signal source 127 are connected in a loop shape.

The buffer circuit 25 is connected between a node N103 and the output node Nout. The buffer circuit 25 includes the input node 25a connected to the node N103 and the output node 25b connected to the output node Nout. The buffer circuit 25 is, for example, a buffer amplifier, and amplifies a received signal by about one time and outputs the amplified signal.

The switch SW3 is connected between the signal source 127 and the node N102. The switch SW3 has a first end connected to the signal source 127, a second end connected to the node N102, and a control terminal that receives the control signal CK. The switch SW3 includes, for example, a transistor. The switch SW3 is turned on when the control signal CK is at the H level and is turned off when the control signal CK is at the L level.

The signal source 127 is connected between a node N104 and the switch SW3. The signal source 127 has a first end connected to the node N104 and a second end connected to the switch SW3. The signal source 127 generates a signal Sin⁻ having a phase opposite to that of the signal Sin received by the main circuit 102a, and outputs the signal Sin⁻ from the second end to the switch SW3.

The inductive network 121 is connected between the input node Nin and the output node Nout. The inductive network 121 is connected between a side on which the nodes N101 and N102 are disposed and a side on which the nodes N103 and N104 are disposed. The inductive network 121 includes: an input node 1211 connected to the node N101 via a line 122; an input node 1212 connected to the node N102 via a line 123; an output node 1213 connected to the node N103 via a line 124; and an output node 1214 connected to the node N104 via a line 126. The node N101 is connected to the input node Nin. The node N102 is connected to the signal source 127 via the switch SW3. The node N103 is connected to the output node Nout via the buffer circuit 25. The node N104 is connected to the signal source 127.

The inductive network 121 may include a network of a plurality of inductive elements, and may be configured such that an inductance value thereof is variable due to mutual inductance between the plurality of inductive elements. The inductive network 121 may be configured as shown in FIG. 7, for example. In the case of FIG. 7, the inductive network 121 includes an inductive element L101 and an inductive element L102.

The inductive element L101 is disposed on the lines 122 and 124, and is connected between the node N101 and the node N103 via the input node 1211 and the output node 1213. The inductive element L101 has a first end connected to the node N101 via the input node 1211 and a second end connected to the node N103 via the output node 1213.

The inductive element L102 is disposed on the lines 123 and 126, and is connected between the node N102 and the node N104 via the input node 1212 and the output node 1214. The inductive element L102 has a first end connected to the node N102 via the input node 1212 and a second end connected to the node N104 via the output node 1214.

The inductive element L101 and the inductive element L102 are disposed at positions where the inductive element L101 and the inductive element L102 can be magnetically coupled to each other (positions close to each other), and are disposed so as to strengthen magnetic fluxes when signal currents of opposite phases flow. An inductance value L102 of the inductive element L102 may be equal to an inductance value L101 of the inductive element L101.

In the waveform shaping circuit 102 shown in FIG. 6, the control signal CK is a signal that periodically varies between the H level and the L level, and a variation period thereof may be shorter than that of the signal Sin. When n is an integer of 2 or more, the frequency of the control signal CK may be n times the frequency of the signal Sin.

Figure 8A:
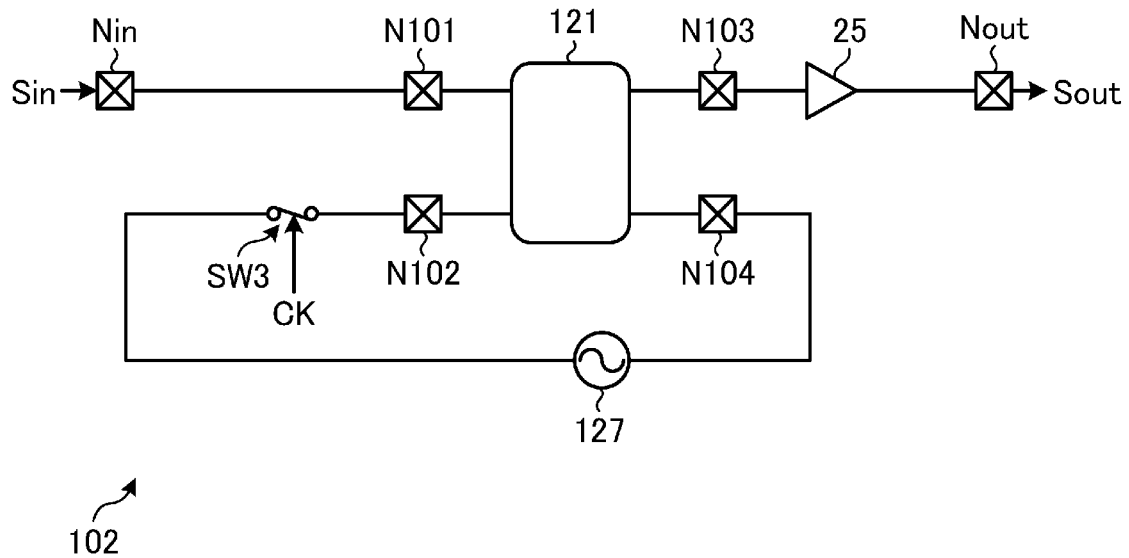
FIGS. 8A and 8B are circuit diagrams showing operations of the waveform shaping circuit according to the first modification of at least one embodiment.
Figure 8B:
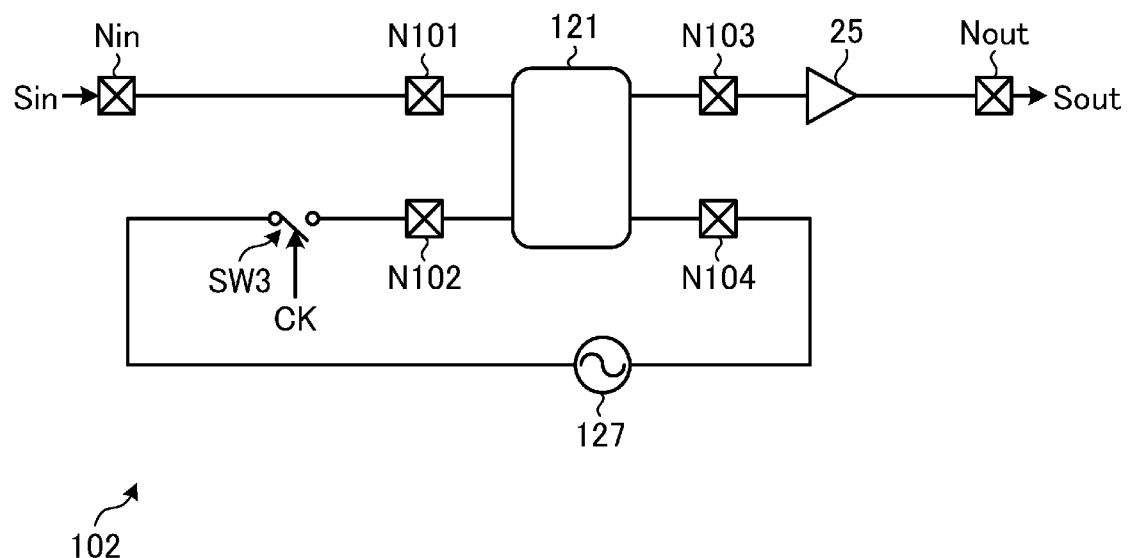

For example, when n=2, the waveform shaping circuit 102 can operate as shown in FIGS. 4, 8A, and 8B. FIGS. 8A and 8B are circuit diagrams showing operations of the waveform shaping circuit 102 according to the first modification of the embodiment.

A connection configuration of the waveform shaping circuit 102 can be switched between a third mode shown in FIG. 8A and a fourth mode shown in FIG. 8B. The third mode corresponds to the first mode shown in FIG. 5A, and the fourth mode corresponds to the second mode shown in FIG. 5B. The waveform shaping circuit 102 is switched to the third mode (FIG. 8A) to operate with an inductance value $L_{A101}$ in the first half period ΔT1 of the period ΔT during which the signal Sin is at the H level shown in FIG. 4, and is switched to the fourth mode (FIG. 8B) to operate with an inductance value $L_{A102}$ in the second half period ΔT2 of the period ΔT during which the signal Sin is at the H level. The inductance value $L_{A102}$ is smaller than the inductance value $L_{A101}$.

The waveform shaping circuit 102 is switched to the third mode (FIG. 8A) to operate with the inductance value $L_{A101}$ in the first half period ΔT1a of the period ΔTa during which the signal Sin is at the L level shown in FIG. 4, and is switched to the fourth mode (FIG. 8B) to operate with the inductance value $L_{A102}$ in the second half period ΔT2a of the period ΔTa during which the signal Sin is at the L level.

At the timing t1, the first half period ΔT1 of the period ΔT during which the signal Sin is at the H level starts. In response to the start of transition of the signal Sin from the L level to the H level, the control signal CK transitions from the L level to the H level. At the timing t1, the waveform shaping circuit 102 is switched to the third mode (FIG. 8A), and the switch SW3 is turned on and maintained in the on state.

Accordingly, for example, a current corresponding to the signal Sin flows through a path of the node N101→the inductive element L101→the node N103 shown in FIG. 7, and a current corresponding to the signal Sin⁻ flows through a path of the node N102→the inductive element L102→the node N104 shown in FIG. 7. The inductive element L101 and the inductive element L102 are disposed at positions where the inductive element L101 and the inductive element L102 can be magnetically coupled to each other (positions close to each other), and are disposed in cumulative connection in which the magnetic fluxes are strengthened when the signal currents of opposite phases flow. As a result, when a coupling coefficient is set as k (0<k<1), an induced voltage corresponding to an inductance value $L_{A101}=L101+k\sqrt{(L101 \times L102)}$ is generated in the inductive network 121, and the voltage at the rising edge of the signal Sin can be raised. For example, the signal Sin can be shaped into a signal in which the rising edge of the signal Sin is overshot. The shaped signal is amplified (for example, by about one time) by the buffer circuit 25 and is output as the signal Sout.

At the timing t2 shown in FIG. 4, the first half period ΔT1 of the period ΔT during which the signal Sin is at the H level ends, and the second half period ΔT2 of the period ΔT during which the signal Sin is at the H level starts. The control signal CK transitions from the H level to the L level. At the timing t2, the waveform shaping circuit 102 is switched to the fourth mode (FIG. 8B), and the switch SW3 is turned off and maintained in the off state.

Accordingly, for example, the current of the signal Sin flows through the path of the node N101→the inductive element L101→the node N103 shown in FIG. 7. No current flows on an inductive element L102 side. As a result, the inductance value of the inductive network 121 can be reduced to $L_{A102}$=L101 (<L101+k√(L101×L102)), and the unwanted ringing of an output signal of the inductive network 121 can be prevented.

At the timing t3 shown in FIG. 4, the first half period ΔT1a of the period ΔTa during which the signal Sin is at the L level starts. In response to the start of the transition of the signal Sin from the H level to the L level, the control signal CK transitions from the L level to the H level. At the timing t3, the waveform shaping circuit 102 is switched to the third mode (FIG. 8A), and the switch SW3 is turned on and maintained in the on state.

Accordingly, for example, the current of the signal Sin flows through the path of the node N101→the inductive element L101→the node N103 shown in FIG. 7, and the current of the signal Sin⁻ flows through the path of the node N102→the inductive element L102→the node N104 shown in FIG. 7. As a result, the induced voltage corresponding to the inductance value $L_{A101}$=L101+k√(L101×L102) is generated in the inductive network 121, and the voltage at the falling edge of the signal Sin can be reduced. For example, the signal Sin can be shaped into a signal in which the falling edge of the signal Sin is undershot. The shaped signal is amplified (for example, by about one time) by the buffer circuit 25 and is output as the signal Sout.

At the timing t4 shown in FIG. 4, the first half period ΔT1a of the period ΔTa during which the signal Sin is at the L level ends, and the second half period ΔT2a of the period ΔTa during which the signal Sin is at the L level starts. The control signal CK transitions from the H level to the L level. At the timing t4, the waveform shaping circuit 102 is switched to the fourth mode (FIG. 8B), and the switch SW3 is turned off and maintained in the off state.

Accordingly, for example, the current of the signal Sin flows through the path of the node N101→the inductive element L101→the node N103 shown in FIG. 7. No current flows on the inductive element L102 side. As a result, the inductance value of the inductive network 121 can be reduced to $L_{A102}$=L101 (<L101+k√(L101×L102)), and the unwanted ringing of the output signal of the inductive network 121 can be prevented.

At the timings t5 to t8, the operations similar to those at the timings t1 to t4 are performed.

As described above, in the waveform shaping circuit 102 according to the first modification, the inductance value can also be increased at the time of the rising or the falling of the waveform to shape the waveform with a large induced voltage, and the inductance value can also be decreased in the subsequent period to prevent the unwanted ringing, so that the slew rate can be appropriately improved and the jitter characteristics related to the slew rate can be improved.

In the waveform shaping circuit 102, the mutual inductance is used to vary the inductance value. That is, since the inductance value can be effectively increased due to mutual induction at the time of the rising or the falling of the waveform, the number and an area of the inductive elements for achieving a desired inductance value can be reduced, and integration as a semiconductor integrated circuit is further facilitated.

Figure 9:
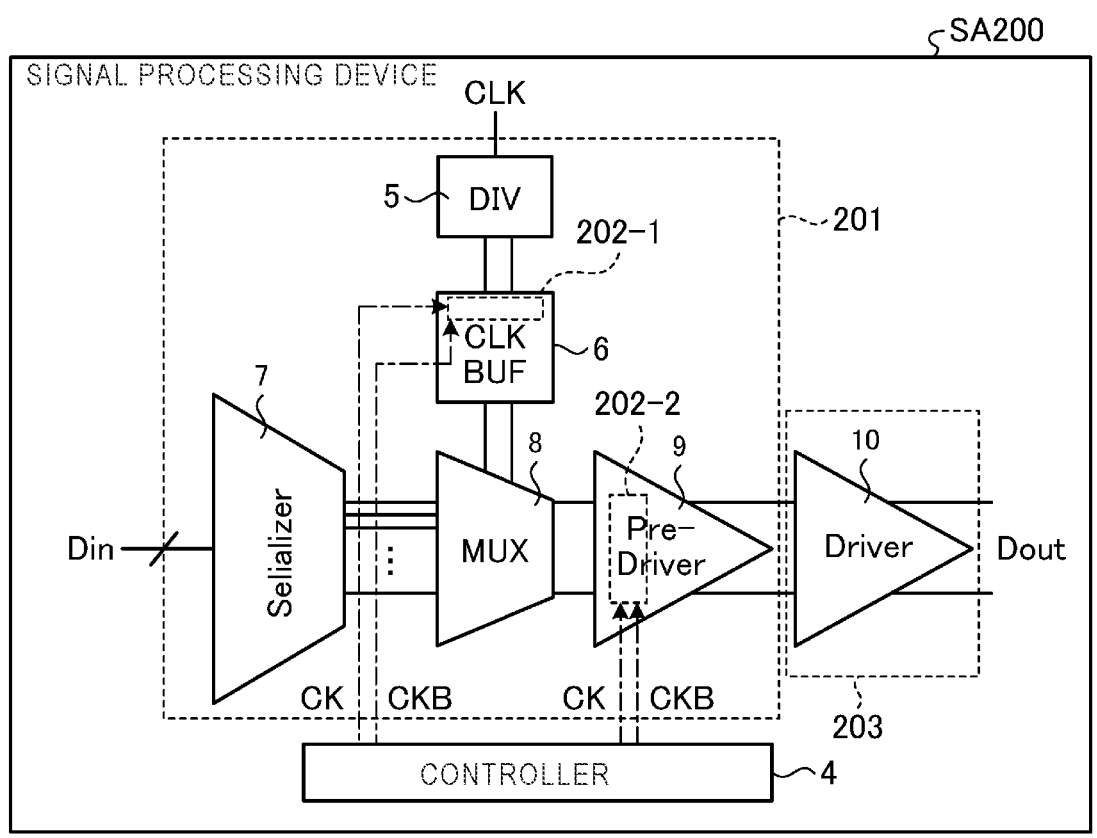
FIG. 9 is a circuit diagram showing a configuration of a signal processing device including a semiconductor integrated circuit according to a second modification of at least one embodiment.
Figure 10:
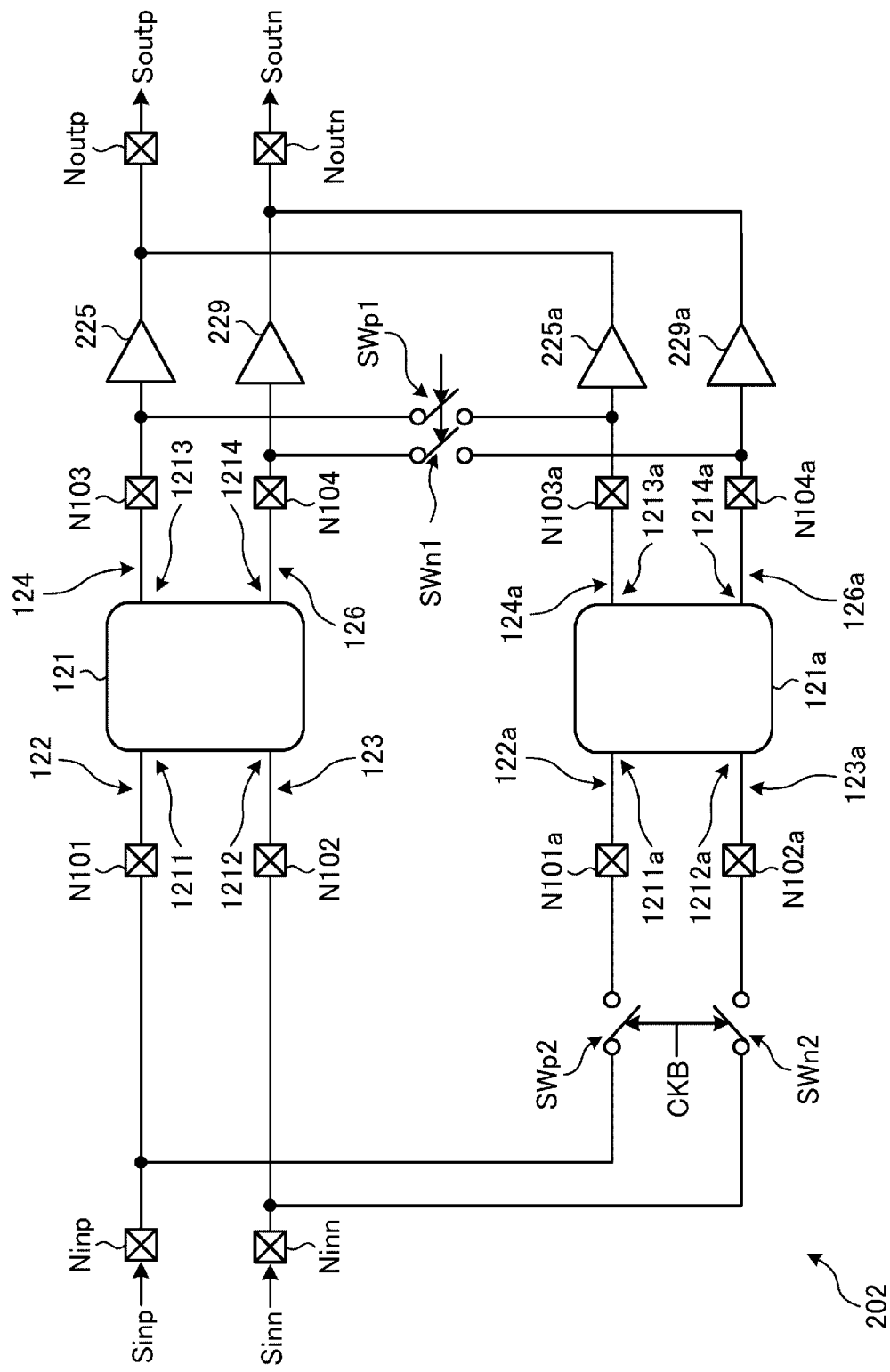
FIG. 10 is a circuit diagram showing a configuration of a waveform shaping circuit according to the second modification of at least one embodiment.

As a second modification of the embodiment, as shown in FIGS. 9 and 10, a semiconductor integrated circuit 201 may include waveform shaping circuits 202-1 and 202-2, and each of the waveform shaping circuits 202-1 and 202-2 may have a differential configuration. FIG. 9 is a circuit diagram showing a configuration of a signal processing device SA200 including the semiconductor integrated circuit 201 according to the second modification of the embodiment. FIG. 10 is a circuit diagram showing a configuration of a waveform shaping circuit 202 according to the second modification of the embodiment. Hereinafter, when the waveform shaping circuits 202-1 and 202-2 are not distinguished from each other, the waveform shaping circuits 202-1 and 202-2 are simply referred to as the waveform shaping circuit 202.

The signal processing device SA200 includes the semiconductor integrated circuit 201, a processing circuit 203, and a controller 4. The semiconductor integrated circuit 201 includes the waveform shaping circuits 202-1 and 202-2. Each of the waveform shaping circuits 202-1 and 202-2 has a differential configuration.

The waveform shaping circuit 202-1 is disposed in a clock buffer (CLKBUF) 6. The waveform shaping circuit 202-1 performs, according to the control signals CK and CKB from the controller 4, waveform shaping processing on a differential clock signal divided and differentiated by a frequency divider (DIV) 5. The processed differential clock signal is buffered in the clock buffer 6 and then supplied to a multiplexer (MUX) 8. The control signals CK and CKB supplied from the controller 4 to the waveform shaping circuit 202-1 are signals synchronized with a signal CLK input to the frequency divider (DIV) 5.

The waveform shaping circuit 202-2 is provided in a pre-driver 9. The waveform shaping circuit 202-2 performs, according to the control signals CK and CKB from the controller 4, waveform shaping processing on a differential data signal serialized by a serializer 7 and selected and differentiated by the multiplexer (MUX) 8 according to the differential clock signal. The processed differential data signal is amplified by the pre-driver 9 and then supplied to a driver 10. The driver 10 amplifies the differential data signal and outputs the amplified differential data signal. The control signals CK and CKB supplied from the controller 4 to the waveform shaping circuit 202-2 are signals synchronized with the signal CLK input to the frequency divider (DIV) 5.

The waveform shaping circuits 202-1 and 202-2 may be configured similarly to each other. Each waveform shaping circuit 202 may be configured as shown in FIG. 10. FIG. 10 is a circuit diagram showing a configuration of the waveform shaping circuit 202. FIG. 10 shows a configuration in which the waveform shaping circuit 202 copes with differential signals. A signal Sinp and a signal Sinn shown in FIG. 10 are signals constituting a differential pair and have opposite phases. A signal Soutp and a signal Soutn are signals constituting a differential pair and have opposite phases.

The waveform shaping circuit 202 is configured such that the inductive network 121 and an inductive network 121a are connected in parallel, and a state in which one side of the parallel connection is powered on and a state in which both sides of the parallel connection are powered on can be switched while maintaining a state in which the mutual inductance is used. The waveform shaping circuit 202 includes switches SWp1, SWn1, SWp2, and SWn2, buffer circuits 225, 225*a*, 229, and 229*a*, and the inductive networks 121 and 121*a*.

The inductive network 121 is connected between a side on which input nodes Ninp and Ninn are disposed and a side on which output nodes Noutp and Noutn are disposed. The inductive network 121 is connected between a side on which the nodes N101 and N102 are disposed and a side on which the nodes N103 and N104 are disposed. The inductive network 121*a* is connected in parallel with the inductive network 121 between the side on which the input nodes Ninp and Ninn are disposed and the side on which the output nodes Noutp and Noutn are disposed. The inductive network 121*a* is connected between a side on which nodes N101*a* and N102*a* are disposed and a side on which nodes N103*a* and N104*a* are disposed.

The switch SWp1 is connected between the node N103 and the node N103*a*. The switch SWp1 has a first end connected to the node N103, a second end connected to the node N103*a*, and a control terminal that receives the control signal CK. The switch SWp1 includes, for example, a transistor. The switch SWp1 is turned on when the control signal CK is at the H level and is turned off when the control signal CK is at the L level.

The switch SWn1 is connected between the node N104 and the node N104*a*. The switch SWn1 has a first end connected to the node N104, a second end connected to the node N104*a*, and a control terminal that receives the control signal CK. The switch SWn1 includes, for example, a transistor. The switch SWn1 is turned on when the control signal CK is at the H level and is turned off when the control signal CK is at the L level.

The switch SWp2 is connected between the input node Ninp and the node N101*a*. The switch SWp2 has a first end connected to the input node Ninp, a second end connected to the node N101*a*, and a control terminal that receives the control signal CKB. The switch SWp2 includes, for example, a transistor. The switch SWp2 is turned on when the control signal CKB is at the H level and is turned off when the control signal CKB is at the L level.

The switch SWn2 is connected between the input node Ninn and the node N102*a*. The switch SWn2 has a first end connected to the input node Ninn, a second end connected to the node N102*a*, and a control terminal that receives the control signal CKB. The switch SWn2 includes, for example, a transistor. The switch SWn2 is turned on when the control signal CKB is at the H level and is turned off when the control signal CKB is at the L level.

The buffer circuit 225 is connected between the node N103 and the output node Noutp. The buffer circuit 225 includes an input node connected to the node N103 and an output node connected to the output node Noutp. The buffer circuit 225 is, for example, a buffer amplifier, and amplifies a received signal by about one time and outputs the amplified signal.

The buffer circuit 229 is connected between the node N104 and the output node Noutn. The buffer circuit 229 includes an input node connected to the node N104 and an output node connected to the output node Noutn. The buffer circuit 229 is, for example, a buffer amplifier, and amplifies a received signal by about one time and outputs the amplified signal.

The buffer circuit 225*a* is connected between the node N103*a* and the output node Noutp. The buffer circuit 225*a* includes an input node connected to the node N103*a* and an output node connected to the output node Noutp. The buffer circuit 225*a* is, for example, a buffer amplifier, and amplifies a received signal by about one time and outputs the amplified signal. The buffer circuit 225*a* has a configuration equivalent to that of the buffer circuit 225.

The buffer circuit 229*a* is connected between the node N104*a* and the output node Noutn. The buffer circuit 229*a* includes an input node connected to the node N104*a* and an output node connected to the output node Noutn. The buffer circuit 229*a* is, for example, a buffer amplifier, and amplifies a received signal by about one time and outputs the amplified signal. The buffer circuit 229*a* has a configuration equivalent to that of the buffer circuit 229.

The inductive network 121 includes: the input node 1211 connected to the node N101 via the line 122; the input node 1212 connected to the node N102 via the line 123; the output node 1213 connected to the node N103 via the line 124; and the output node 1214 connected to the node N104 via the line 126. The node N101 is connected to the input node Ninp. The node N102 is connected to the input node Ninn. The node N103 is connected to the output node Noutp via the buffer circuit 225. The node N104 is connected to the output node Noutn via the buffer circuit 229.

The inductive network 121*a* includes: an input node 1211*a* connected to the node N101*a* via a line 122*a*; an input node 1212*a* connected to the node N102*a* via a line 123*a*; an output node 1213*a* connected to the node N103*a* via a line 124*a*; and an output node 1214*a* connected to the node N104*a* via a line 126*a*. The node N101*a* is connected to the input node Ninp via the switch SWp2. The node N102*a* is connected to the input node Ninn via the switch SWn2. The node N103*a* is connected to the output node Noutp via the buffer circuit 225*a*. The node N104*a* is connected to the output node Noutn via the buffer circuit 229*a*.

The inductive networks 121 and 121*a* may be configured in the same manner as in FIG. 7.

In the waveform shaping circuit 202 shown in FIG. 10, the control signal CKB is a signal complementary to the control signal CK. Each of the control signals CK and CKB is a signal that periodically varies between the H level and the L level, and a variation period thereof may be shorter than that of the signal Sin. When n is an integer of 2 or more, the frequency of each of the control signals CK and CKB may be n times the frequency of the signal Sin.

Figure 11A:
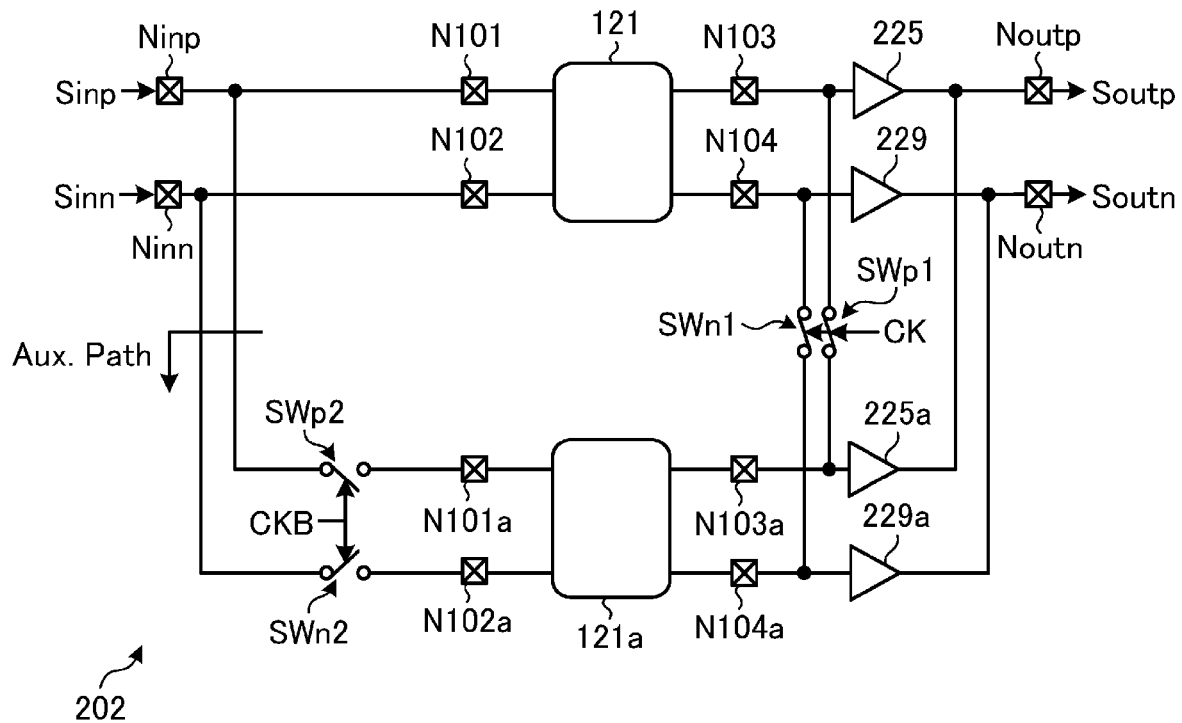
FIGS. 11A and 11B are circuit diagrams showing operations of the waveform shaping circuit according to the second modification of at least one embodiment.
Figure 11B:
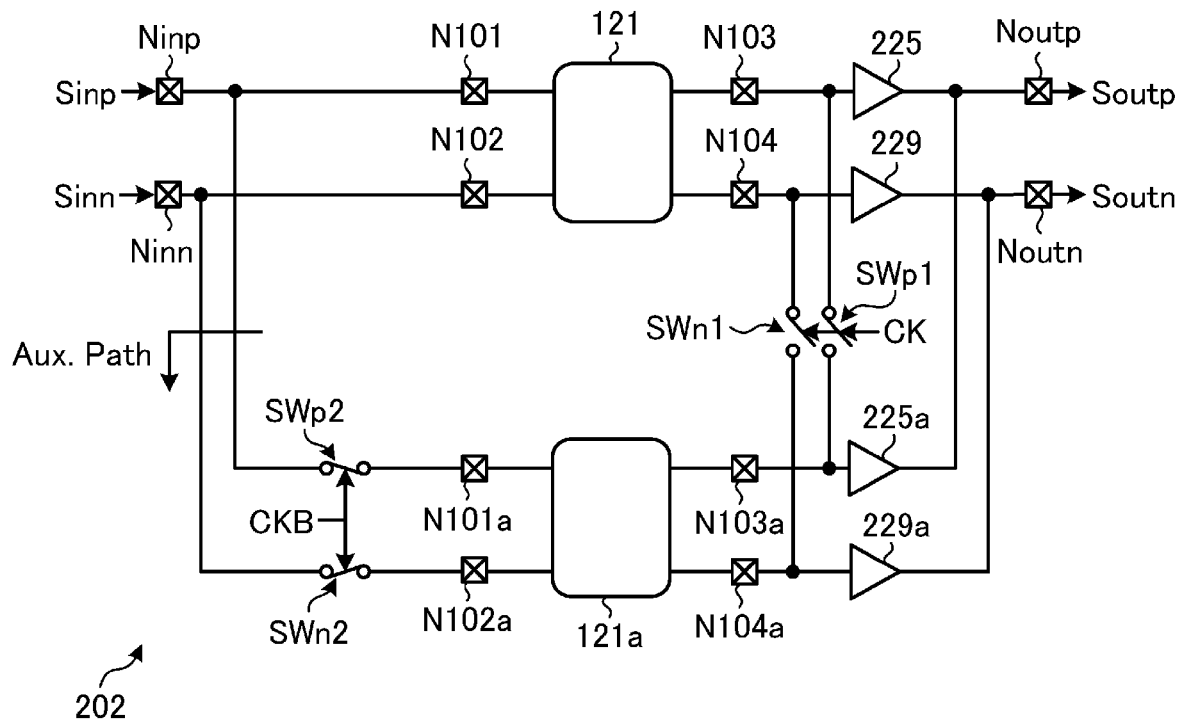

For example, when n=2, the waveform shaping circuit 102 can operate as illustrated in FIGS. 4, 11A, and 11B. FIGS. 11A and 11B are circuit diagrams illustrating operations of the waveform shaping circuit 202 according to the second modification of the embodiment.

A connection configuration of the waveform shaping circuit 202 can be switched between a fifth mode shown in FIG. 11A and a sixth mode shown in FIG. 11B. The fifth mode corresponds to the first mode shown in FIG. 5A, and the sixth mode corresponds to the second mode shown in FIG. 5B. The waveform shaping circuit 202 is switched to the fifth mode (FIG. 11A) to operate with an inductance value $L_{A201}$ in the first half period $\Delta T1$ of the period $\Delta T$ during which the signal Sinp is at the H level shown in FIG. 4, and is switched to the sixth mode (FIG. 11B) to operate with an inductance value $L_{A202}$ in the second half period $\Delta T2$ of the period $\Delta T$ during which the signal Sinp is at the H level. The inductance value $L_{A202}$ is smaller than the inductance value $L_{A201}$.

The waveform shaping circuit 202 is switched to the fifth mode (FIG. 11A) to operate with the inductance value $L_{A201}$ in the first half period $\Delta T1a$ of the period $\Delta Ta$ during which the signal Sinp is at the L level shown in FIG. 4, and is switched to the sixth mode (FIG. 11B) to operate with the inductance value $L_{A202}$ in the second half period $\Delta T2a$ of the period $\Delta Ta$ during which the signal Sinp is at the L level.

At the timing t1 shown in FIG. 4, the first half period $\Delta T1$ of the period $\Delta T$ during which the signal Sinp is at the H level starts. In response to a start of transition of the signal Sinp from the L level to the H level, the control signal CK transitions from the L level to the H level, and the control signal CKB transitions from the H level to the L level. At the timing t1, the waveform shaping circuit 202 is switched to the fifth mode (FIG. 11A), the switches SWp1 and SWn1 are turned on and maintained in the on state, and the switches SWp2 and SWn2 are turned off and maintained in the off state.

Figure 12A:
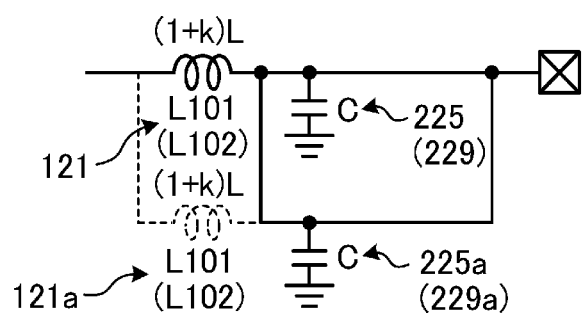
FIGS. 12A and 12B are equivalent circuit diagrams showing operations of the waveform shaping circuit according to the second modification of at least one embodiment.
Figure 12B:
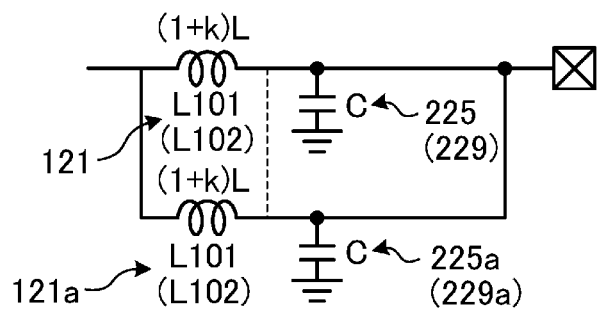

According, a current flows through the inductive network 121, and no current flows through the inductive network 121a, so that a current path on one side of the differential configuration becomes as shown in FIG. 12A. FIGS. 12A and 12B are equivalent circuit diagrams showing operations of the waveform shaping circuit according to the second modification of the embodiment. FIG. 12A illustrates a current path on a P side of the differential configuration. At this time, when the coupling coefficient k satisfies 0<k<1 and L101=L102=L, an induced voltage corresponding to an inductance value $L_{A201}=(1+k)L$ is generated in the inductive network 121.

As a result, a voltage at a rising edge of the signal Sinp can be raised similarly to the Sout shown in FIG. 4, and a voltage at a falling edge of the signal Sinn can be lowered similarly to a waveform obtained by inverting a phase of the Sout shown in FIG. 4. For example, the signal Sinp can be shaped into a signal Sp in which the rising edge of the signal Sinp is overshot, and the signal Sinn can be shaped into a signal Sn in which the falling edge of the signal Sinn is undershot. The shaped signals are amplified (for example, by about one time) by the buffer circuits 225 and 229 and are output as the signals Soutp and Soutn.

At the timing t2, the first half period $\Delta T1$ of the period $\Delta T$ during which the signal Sinp is at the H level ends, and the second half period $\Delta T2$ of the period $\Delta T$ during which the signal Sinp is at the H level starts. The control signal CK transitions from the H level to the L level, and the control signal CKB transitions from the L level to the H level. At the timing t2, the waveform shaping circuit 202 is switched to the sixth mode (FIG. 11B), the switches SWp1 and SWn1 are turned off and maintained in the off state, and the switches SWp2 and SWn2 are turned on and maintained in the on state.

Accordingly, currents flow through the inductive networks 121 and 121a, so that a current path on one side of the differential configuration becomes as shown in FIG. 12B. FIG. 12B shows a current path on the P side of the differential configuration. At this time, the induced voltage corresponding to the inductance value (1+k)L is generated in each of the inductive networks 121 and 121a. Therefore, an inductance value of the waveform shaping circuit 202 as a whole can be reduced to $L_{A202}=(1+k)L/2$. As a result, ringing of each of the signals Sp and Sn can be prevented.

At the timing t3 shown in FIG. 4, the first half period $\Delta T1a$ of the period $\Delta Ta$ during which the signal Sinp is at the L level starts. In response to the start of transition of the signal Sinp from the H level to the L level, the control signal CK transitions from the L level to the H level, and the control signal CKB transitions from the H level to the L level. At the timing t3, the waveform shaping circuit 202 is switched to the fifth mode (FIG. 11A), the switches SWp1 and SWn1 are turned on and maintained in the on state, and the switches SWp2 and SWn2 are turned off and maintained in the off state.

Accordingly, a current flows through the inductive network 121, and no current flows through the inductive network 121a, so that the current path on one side of the differential configuration becomes as shown in FIG. 12A. At this time, the induced voltage corresponding to the inductance value $L_{A201}=(1+k)L$ is generated in the inductive network 121.

As a result, a voltage at a falling edge of the signal Sinp can be lowered similarly to the Sout shown in FIG. 4, and a voltage at a rising edge of the signal Sinn can be raised similarly to the waveform obtained by inverting the phase of the Sout shown in FIG. 4. For example, the signal Sinp can be shaped into the signal Sp in which the falling edge of the signal Sinp is undershot, and the signal Sinn can be shaped into the signal Sn in which the rising edge of the signal Sinn is overshot. The shaped signals are amplified (for example, by about one time) by the buffer circuits 225 and 229 and are output as the signals Soutp and Soutn.

At the timing t4, the first half period $\Delta T1a$ of the period $\Delta Ta$ during which the signal Sinp is at the L level ends, and the second half period $\Delta T2a$ of the period $\Delta Ta$ during which the signal Sinp is at the L level starts. The control signal CK transitions from the H level to the L level, and the control signal CKB transitions from the L level to the H level. At the timing t4, the waveform shaping circuit 202 is switched to the sixth mode (FIG. 11B), the switches SWp1 and SWn1 are turned off and maintained in the off state, and the switches SWp2 and SWn2 are turned on and maintained in the on state.

Accordingly, currents flow through the inductive networks 121 and 121a, so that the current path on one side of the differential configuration becomes as shown in FIG. 12B. At this time, the induced voltage corresponding to the inductance value (1+k)L is generated in each of the inductive networks 121 and 121a. Therefore, the inductance value of the waveform shaping circuit 202 as a whole can be reduced to $L_{A202}=(1+k)L/2$. As a result, the ringing of each of the signals Sp and Sn can be prevented.

At the timings t5 to t8, the operations similar to those at the timings t1 to t4 are performed.

As shown in FIGS. 12A and 12B, each of the buffer circuits 225, 225a, 229, and 229a can be equivalently regarded as a capacitive element C having one end connected to a corresponding line and the other end connected to ground potential. By configuring the buffer circuits 225, 225a, 229, and 229a to be equivalent to one another, the capacitance values of the equivalent capacitive elements C can be made equal to one another. Since the equivalent buffer circuits 225, 225a, 229, and 229a are disposed on an output side of the inductive networks 121 and 121a, signal amplitudes can be made equal between the fifth mode (FIG. 11A) and the sixth mode (FIG. 11B), and fluctuation of circuit characteristics and the like due to switching can be prevented.

As described above, in the waveform shaping circuit 202, the inductance value can also be increased at the time of the rising or the falling of the waveform to shape the waveform with a large induced voltage, and the inductance value can also be decreased in the subsequent period to prevent the ringing, so that the slew rate can be appropriately improved and the jitter characteristics related to the slew rate can be improved.

In the waveform shaping circuit 202, the mutual inductance is used to vary the inductance value. That is, since the inductance value can be effectively increased due to mutual induction at the time of the rising or the falling of the waveform, the number and an area of the inductive elements for achieving a desired inductance value can be reduced, and integration as a semiconductor integrated circuit is further facilitated.

Figure 13:
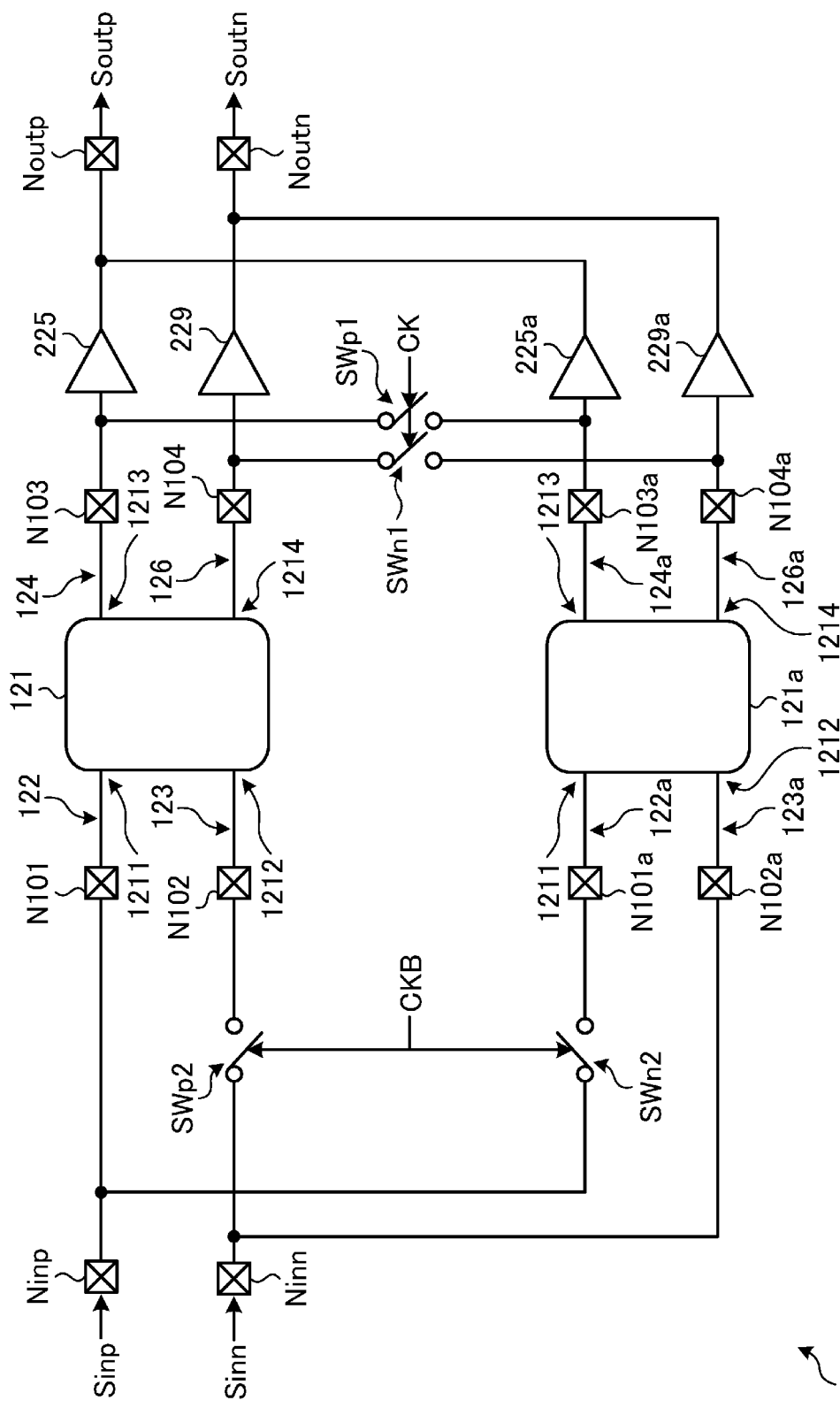
FIG. 13 is a circuit diagram showing a configuration of a waveform shaping circuit according to a third modification of at least one embodiment.

As a third modification of the embodiment, as shown in FIG. 13, a waveform shaping circuit 302 may have a differential configuration, and a signal may be switched between an input side and an output side of the waveform shaping circuit 302. FIG. 13 is a circuit diagram showing a configuration of the waveform shaping circuit 302 according to the third modification of the embodiment.

The waveform shaping circuit 302 is configured such that the inductive network 121 and the inductive network 121a are connected in parallel, and a state in which the mutual induction does not function and a state in which the mutual induction functions can be switched in the inductive networks 121 and 121a. The waveform shaping circuit 302 includes the switches SWp1, SWn1, SWp2, and SWn2, the buffer circuits 225, 225a, 229, and 229a, and the inductive networks 121 and 121a.

With respect to the waveform shaping circuit 202 (FIG. 10), the waveform shaping circuit 302 is obtained by moving the switch SWp2 from between the input node Ninp and the node N101a to between the input node Ninn and the node N102, and moving the switch SWn2 from between the input node Ninn and the node N102a to between the input node Ninp and the node N101a. The switch SWp2 has a first end connected to the input node Ninn, a second end connected to the node N102, and a control terminal that receives the control signal CKB. The switch SWn2 has a first end connected to the input node Ninp, a second end connected to the node N101a, and a control terminal that receives the control signal CKB.

Each of the inductive networks 121 and 121a may be configured in the same manner as in FIG. 7, for example. In this case, the inductive element L101 and the inductive element L102 may be disposed so as to strengthen the magnetic fluxes when the signal currents of opposite phases flow through, or may be disposed so as to weaken the magnetic fluxes when the signal currents of opposite phases flow through.

Figure 14A:
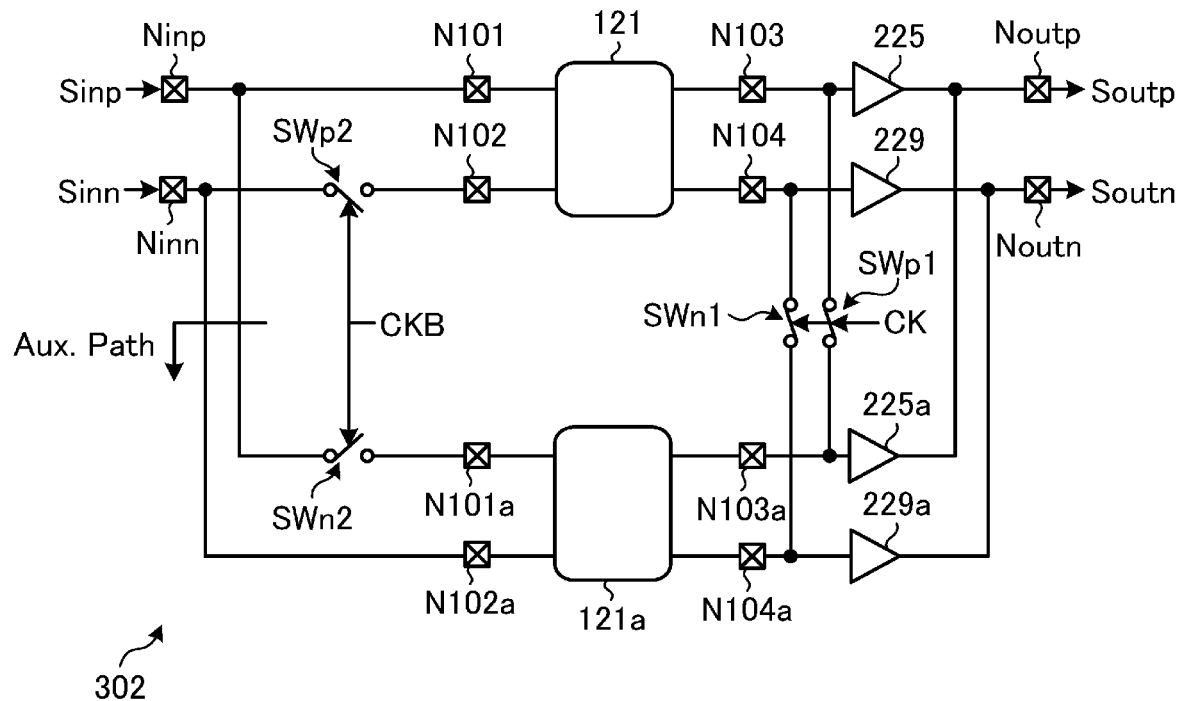
FIGS. 14A and 14B are circuit diagrams showing operations of the waveform shaping circuit according to the third modification of at least one embodiment.
Figure 14B:
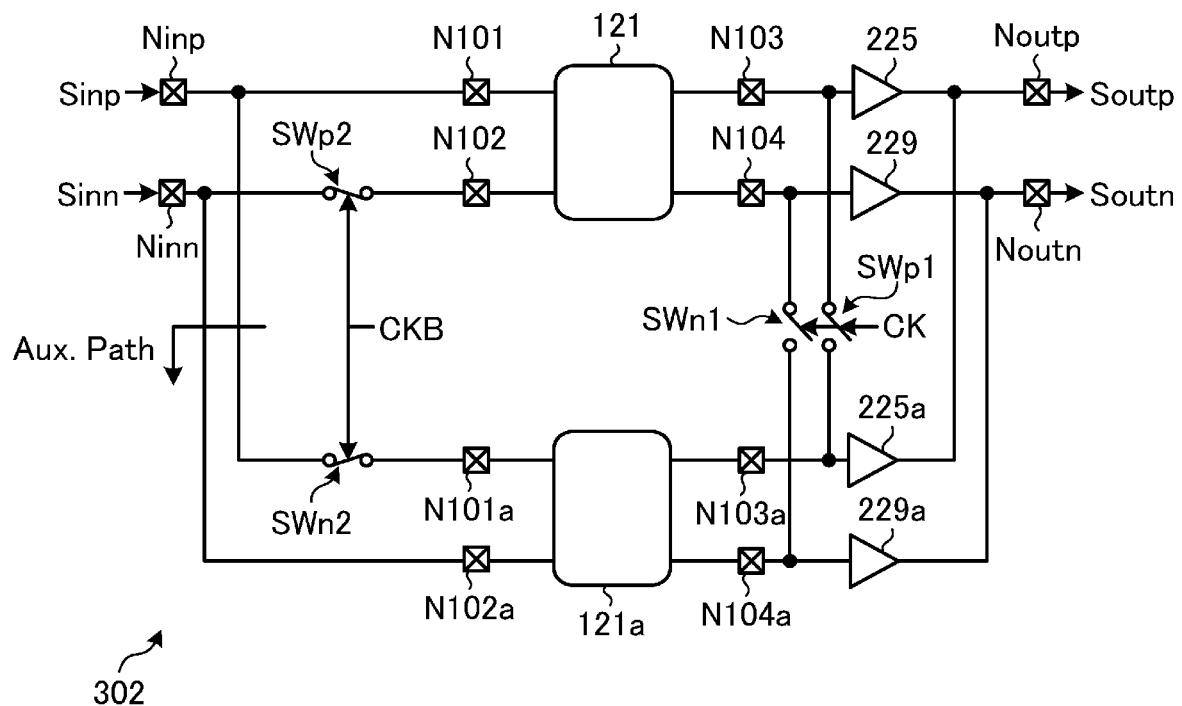

For example, the waveform shaping circuit 302 can operate as shown in FIGS. 4, 14A, and 14B. FIGS. 14A and 14B are circuit diagrams showing operations of the waveform shaping circuit 302 according to the third modification of the embodiment.

A connection configuration of the waveform shaping circuit 302 can be switched between a seventh mode shown in FIG. 14A and an eighth mode shown in FIG. 14B. The seventh mode corresponds to the first mode shown in FIG. 5A, and the eighth mode corresponds to the second mode shown in FIG. 5B. The waveform shaping circuit 302 is switched to the seventh mode (FIG. 14A) to operate with an inductance value $L_{A301}$ in the first half period ΔT1 of the period ΔT during which the signal Sinp is at the H level shown in FIG. 4, and is switched to the eighth mode (FIG. 14B) to operate with an inductance value $L_{A302}$ in the second half period ΔT2 of the period ΔT during which the signal Sinp is at the H level. The inductance value $L_{A302}$ is smaller than the inductance value $L_{A301}$.

The waveform shaping circuit 302 is switched to the seventh mode (FIG. 14A) to operate with the inductance value $L_{A301}$ in the first half period ΔT1a of the period ΔTa during which the signal Sinp is at the L level shown in FIG. 4, and is switched to the eighth mode (FIG. 14B) to operate with the inductance value $L_{A302}$ in the second half period ΔT2a of the period ΔTa during which the signal Sinp is at the L level.

At the timing t1 shown in FIG. 4, the first half period ΔT1 of the period ΔT during which the signal Sinp is at the H level starts. In response to the start of transition of the signal Sinp from the L level to the H level, the control signal CK transitions from the L level to the H level, and the control signal CKB transitions from the H level to the L level. At the timing t1, the waveform shaping circuit 302 is switched to the seventh mode (FIG. 14A), the switches SWp1 and SWn1 are turned on and maintained in the on state, and the switches SWp2 and SWn2 are turned off and maintained in the off state.

Figure 15A:
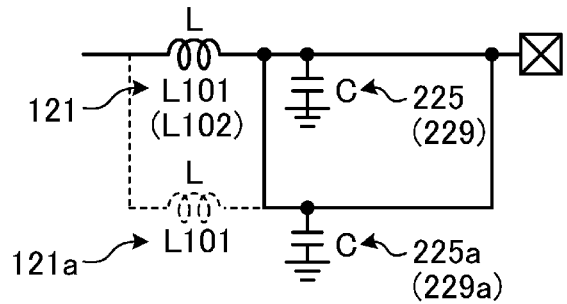
FIGS. 15A, 15B, 15C, and 15D are equivalent circuit diagrams showing operations of the waveform shaping circuit according to the third modification of at least one embodiment.
Figure 15B:
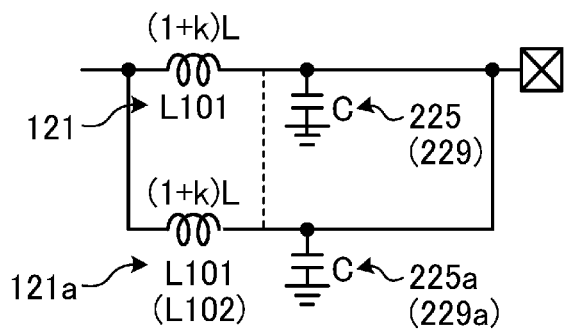
Figure 15C:
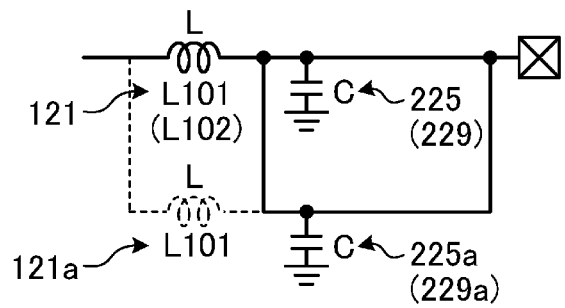

Accordingly, a current selectively flows to the P side (the inductive element L101 side) in the inductive network 121, and a current selectively flows to an N side (the inductive element L102 side) in the inductive network 121a, so that a current path on one side of the differential configuration becomes as shown in FIG. 15A or FIG. 15C. FIGS. 15A, 15B, 15C, and 15D are equivalent circuit diagrams showing operations of the waveform shaping circuit according to the third modification of the embodiment. At this time, when L101=L102=L, an induced voltage corresponding to an inductance value $L_{A301}$=L is generated in each of the inductive networks 121 and 121a.

As a result, the voltage at the rising edge of the signal Sinp can be raised similarly to the Sout shown in FIG. 4, and the voltage at the falling edge of the signal Sinn can be lowered similarly to the waveform obtained by inverting the phase of the Sout shown in FIG. 4. For example, the signal Sinp can be shaped into the signal Sp in which the rising edge of the signal Sinp is overshot, and the signal Sinn can be shaped into the signal Sn in which the falling edge of the signal Sinn is undershot. The shaped signals are amplified (for example, by about one time) by the buffer circuits 225 and 229 and are output as the signals Soutp and Soutn.

At the timing t2, the first half period ΔT1 of the period ΔT during which the signal Sinp is at the H level ends, and the second half period ΔT2 of the period ΔT during which the signal Sinp is at the H level starts. The control signal CK transitions from the H level to the L level, and the control signal CKB transitions from the L level to the H level. At the timing t2, the waveform shaping circuit 302 is switched to the eighth mode (FIG. 14B), the switches SWp1 and SWn1 are turned off and maintained in the off state, and the switches SWp2 and SWn2 are turned on and maintained in the on state.

Accordingly, a current flows to both the P side and the N side in each of the inductive networks 121 and 121a. Therefore, when the inductive element L101 and the inductive element L102 are disposed so as to strengthen the magnetic fluxes when the signal currents of opposite phases flow through, a current path on one side of the differential configuration becomes as shown in FIG. 15B. In this case, the coupling coefficient k satisfies 0<k<1. In each of the inductive networks 121 and 121a, the induced voltage corresponding to (1+k)L is generated, and an inductance value of the waveform shaping circuit 302 as a whole can be reduced to $L_{A302}$=(1+k)L/2 (<L). As a result, the unwanted ringing of each of the signals Sp and Sn can be prevented.

Figure 15D:
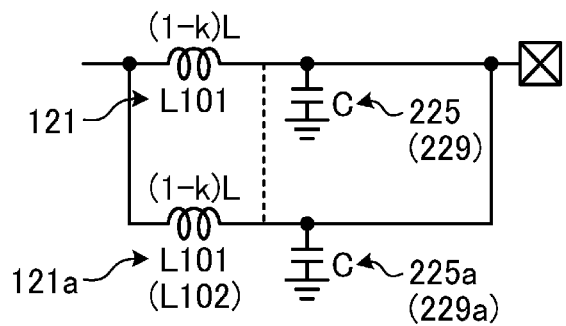

Alternatively, in the inductive networks 121 and 121a, when the inductive element L101 and the inductive element L102 are disposed so as to weaken the magnetic fluxes when the signal currents of opposite phases flow through, a current path on one side of the differential configuration becomes as shown in FIG. 15D. In this case, the coupling coefficient k satisfies 0<k<1. In each of the inductive networks 121 and 121*a*, an induced voltage corresponding to (1−k)L is generated, and the inductance value of the waveform shaping circuit 302 as a whole can be reduced to $L_{A302}=(1-k)L/2$ (<L). As a result, the unwanted ringing of each of the signals Sp and Sn can be prevented.

At the timing t3 shown in FIG. 4, the first half period ΔT1*a* of the period ΔTa during which the signal Sinp is at the L level starts. In response to the start of transition of the signal Sinp from the H level to the L level, the control signal CK transitions from the L level to the H level, and the control signal CKB transitions from the H level to the L level. At the timing t3, the waveform shaping circuit 302 is switched to the seventh mode (FIG. 14A), the switches SWp1 and SWn1 are turned on and maintained in the on state, and the switches SWp2 and SWn2 are turned off and maintained in the off state.

Accordingly, a current selectively flows to the P side (the inductive element L101 side) in the inductive network 121, and a current selectively flows to the N side (the inductive element L102 side) in the inductive network 121*a*, so that the current path on one side of the differential configuration becomes as shown in FIG. 15A or FIG. 15C. At this time, the induced voltage corresponding to the inductance value $L_{A301}=L$ is generated in each of the inductive networks 121 and 121*a*.

As a result, the voltage at the falling edge of the signal Sinp can be lowered similarly to the Sout shown in FIG. 4, and the voltage at the rising edge of the signal Sinn can be raised similarly to the waveform obtained by inverting the Sout shown in FIG. 4. For example, the signal Sinp can be shaped into the signal Sp in which the falling edge of the signal Sinp is undershot, and the signal Sinn can be shaped into the signal Sn in which the rising edge of the signal Sinn is overshot. The shaped signals are amplified (for example, by about one time) by the buffer circuits 225 and 229 and are output as the signals Soutp and Soutn.

At the timing t4, the first half period ΔT1*a* of the period ΔTa during which the signal Sinp is at the L level ends, and the second half period ΔT2*a* of the period ΔTa at the L level of the signal Sinp starts. The control signal CK transitions from the H level to the L level, and the control signal CKB transitions from the L level to the H level. At the timing t4, the waveform shaping circuit 302 is switched to the eighth mode (FIG. 14B), the switches SWp1 and SWn1 are turned off and maintained in the off state, and the switches SWp2 and SWn2 are turned on and maintained in the on state.

Accordingly, a current flows to both the P side and the N side in each of the inductive networks 121 and 121*a*. Therefore, when the inductive element L101 and the inductive element L102 are disposed so as to strengthen the magnetic fluxes when the signal currents of opposite phases flow through, the current path on one side of the differential configuration becomes as shown in FIG. 15B. At this time, in each of the inductive networks 121 and 121*a*, the induced voltage corresponding to (1+k)L is generated, and the inductance value of the waveform shaping circuit 302 as a whole can be reduced to $L_{A302}=(1+k)L/2$ (<L). As a result, the unwanted ringing of each of the signals Sp and Sn can be prevented.

Alternatively, in the inductive networks 121 and 121*a*, when the inductive element L101 and the inductive element L102 are disposed so as to weaken the magnetic fluxes when the signal currents of opposite phases flow through, the current path on one side of the differential configuration becomes as illustrated in FIG. 15D. At this time, in each of the inductive networks 121 and 121*a*, the induced voltage corresponding to (1−k)L is generated, and the inductance value of the waveform shaping circuit 302 as a whole can be reduced to $L_{A302}=(1-k)L/2$ (<L). As a result, the unwanted ringing of each of the signals Sp and Sn can be prevented.

At the timings t5 to t8, the operations similar to those at the timings t1 to t4 are performed.

As shown in FIGS. 15A to 15D, each of the buffer circuits 225, 225*a*, 229, and 229*a* can be equivalently regarded as a capacitive element C having one end connected to the corresponding line and the other end connected to the ground potential. By configuring the buffer circuits 225, 225*a*, 229, and 229*a* to be equivalent to one another, the capacitance values of the equivalent capacitive elements C can be made equal to one another. Since the equivalent buffer circuits 225, 225*a*, 229, and 229*a* are disposed on the output side of the inductive networks 121 and 121*a*, signal amplitudes can be made equal between the seventh mode (FIG. 14A) and the eighth mode (FIG. 14B), and the fluctuation of circuit characteristics and the like due to switching can be prevented.

As described above, in the waveform shaping circuit 302, the inductance value can also be increased at the time of the rising or the falling of the waveform to shape the waveform with a large induced voltage, and the inductance value can also be decreased in the subsequent period to prevent ringing, so that the slew rate can be appropriately improved and the jitter characteristics related to the slew rate can be improved.

Figure 16:
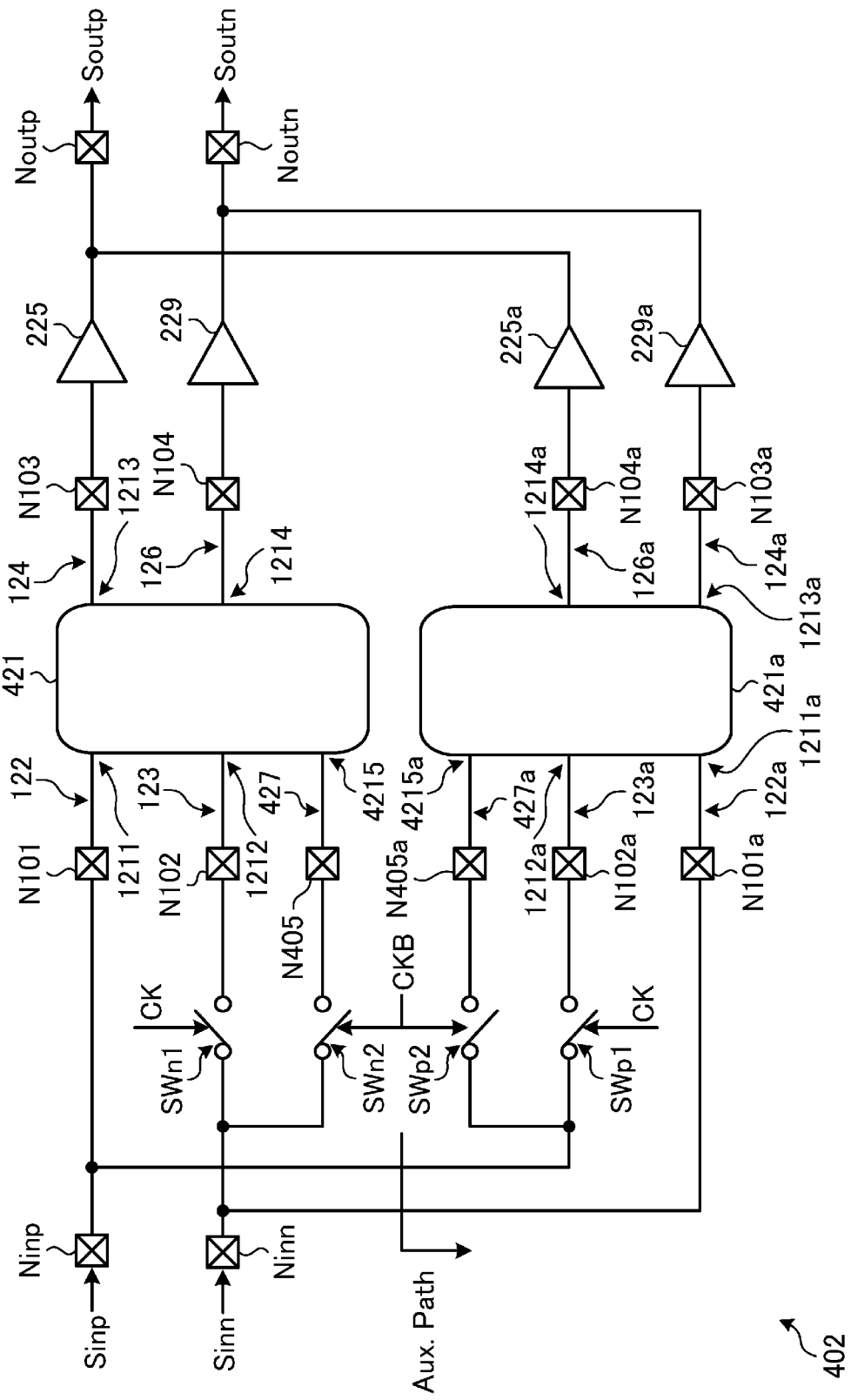
FIG. 16 is a circuit diagram showing a configuration of a waveform shaping circuit according to a fourth modification of at least one embodiment.

As a fourth modification of the embodiment, as shown in FIG. 16, a waveform shaping circuit 402 may have a differential configuration, and a signal may be switched on the input side. FIG. 16 is a circuit diagram showing a configuration of the waveform shaping circuit 402 according to the fourth modification of the embodiment.

The waveform shaping circuit 402 is configured such that an inductive network 421 and an inductive network 421*a* are connected in parallel, and a state in which the coupling coefficient of the mutual induction is large and a state in which the coupling coefficient of the mutual induction is small can be switched in the inductive networks 421 and 421*a*. The waveform shaping circuit 402 includes the switches SWp1, SWn1, SWp2, and SWn2, the buffer circuits 225, 225*a*, 229, and 229*a*, and the inductive networks 421 and 421*a*.

With respect to the waveform shaping circuit 302 (FIG. 13), the waveform shaping circuit 402 is obtained by: moving the switch SWp1 from between the node N103 and the buffer circuit 225*a* to between the input node Ninp and the node N102*a*; moving the switch SWn1 from between the node N104 and the buffer circuit 229*a* to between the input node Ninn and the node N102; adding a line 427 including a node N405 between the input node Ninn and the inductive network 421; adding a line 427*a* including a node N405*a* between the input node Ninp and the inductive network 421*a*; moving the switch SWp2 from between the input node Ninn and the node N102 to between the input node Ninp and the node N405*a*; and moving the switch SWn2 from between the input node Ninp and the node N101*a* to between the input node Ninn and the node N405. The switch SWp1 has a first end connected to the input node Ninp, a second end connected to the node N102*a*, and a control terminal that receives the control signal CK. The switch SWn1 has a first end connected to the input node Ninn, a second end connected to the node N102, and a control terminal that receives the control signal CK. The switch SWp2 has a first end connected to the input node Ninp, a second end connected to the node N405*a*, and a control terminal that receives the control signal CKB. The switch SWn2 has a first end connected to the input node Ninn, a second end connected to the node N405, and a control terminal that receives the control signal CKB.

As compared with the inductive network 121 (see FIG. 6), the inductive network 421 further includes an input node 4215 connected to the node N405 via the line 427. As compared with the inductive network 121 (see FIG. 6), the inductive network 421a further includes an input node 4215a connected to the node N405a via the line 427a.

Figure 17:
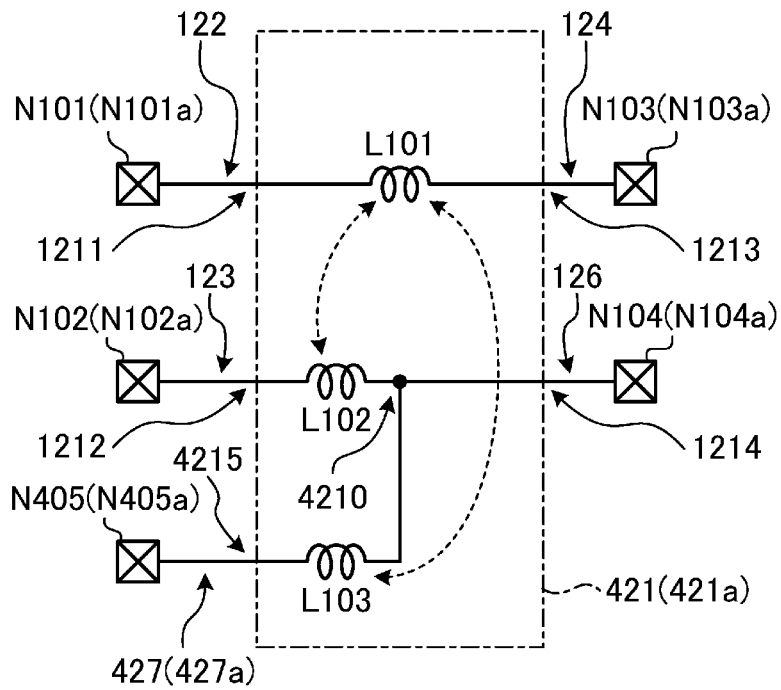
FIG. 17 is a circuit diagram showing a configuration of an inductive network according to the fourth modification of at least one embodiment.

The inductive network 421 may be configured as shown in FIG. 17, for example. FIG. 17 is obtained by providing a node 4210 between the inductive element L102 and the node N104, additionally connecting an inductive element L103 to the node 4210, and connecting the node N405 to the inductive element L103 via the input node 4215 and the line 427, with respect to the configuration shown in FIG. 7. The inductive network 421a has the same configuration as that of the inductive network 421. In this case, the inductive element L101 and the inductive element L102 may be disposed so as to strengthen the magnetic fluxes when the signal currents of opposite phases flow through, or may be disposed so as to weaken the magnetic fluxes when the signal currents of opposite phases flow through. The inductive element L101 and the inductive element L103 may be disposed so as to strengthen the magnetic fluxes when the signal currents of opposite phases flow through, or may be disposed so as to weaken the magnetic fluxes when the signal currents of opposite phases flow through.

Figure 18A:
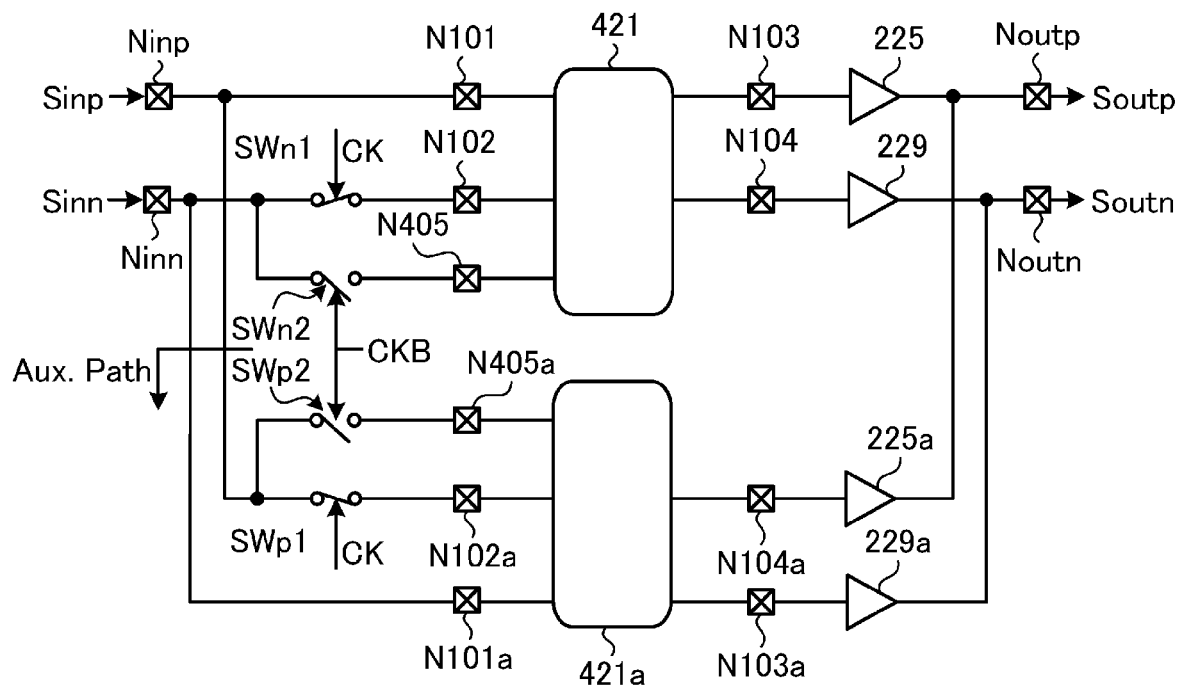
FIGS. 18A and 18B are circuit diagrams showing operations of the waveform shaping circuit according to the fourth modification of at least one embodiment.
Figure 18B:
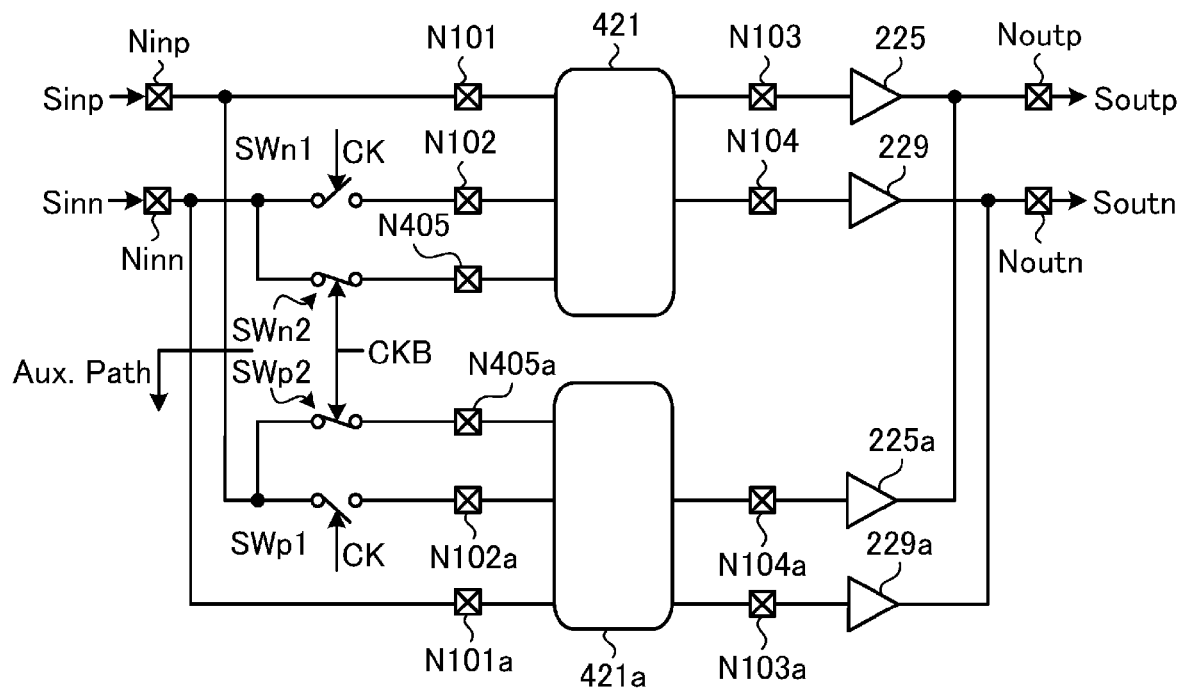

For example, the waveform shaping circuit 402 can operate as shown in FIGS. 4, 18A, and 18B. FIGS. 18A and 18B are circuit diagrams showing operations of the waveform shaping circuit 402 according to the fourth modification of the embodiment.

A connection configuration of the waveform shaping circuit 402 can be switched between a ninth mode shown in FIG. 18A and a tenth mode shown in FIG. 18B. The ninth mode corresponds to the first mode shown in FIG. 5A, and the tenth mode corresponds to the second mode shown in FIG. 5B. The waveform shaping circuit 402 is switched to the ninth mode (FIG. 18A) to operate with an inductance value $L_{A401}$ in the first half period $\Delta T1$ of the period $\Delta T$ during which the signal Sinp is at the H level shown in FIG. 4, and is switched to the tenth mode (FIG. 18B) to operate with an inductance value $L_{A402}$ in the second half period $\Delta T2$ of the period $\Delta T$ during which the signal Sinp is at the H level. The inductance value $L_{A402}$ is smaller than the inductance value $L_{A401}$.

The waveform shaping circuit 402 is switched to the ninth mode (FIG. 18A) to operate with the inductance value $L_{A401}$ in the first half period $\Delta T1a$ of the period $\Delta Ta$ during which the signal Sinp is at the L level shown in FIG. 4, and is switched to the tenth mode (FIG. 18B) to operate with the inductance value $L_{A402}$ in the second half period $\Delta T2a$ of the period $\Delta Ta$ during which the signal Sinp is at the L level.

At the timing t1 shown in FIG. 4, the first half period $\Delta T1$ of the period $\Delta T$ during which the signal Sinp is at the H level starts. In response to the start of transition of the signal Sinp from the L level to the H level, the control signal CK transitions from the L level to the H level, and the control signal CKB transitions from the H level to the L level. At the timing t1, the waveform shaping circuit 402 is switched to the ninth mode (FIG. 18A), the switches SWp1 and SWn1 are turned on and maintained in the on state, and the switches SWp2 and SWn2 are turned off and maintained in the off state.

Accordingly, in the inductive network 421, a current flows through the inductive element L101 on the P side, and a current flows through the inductive element L102 on the N side. In the inductive network 421a, a current flows through the inductive element L102 on the P side and a current flows through the inductive element L101 on the N side. Therefore, when the inductive element L101 and the inductive element L102 are disposed so as to strengthen the magnetic fluxes when the signal currents of opposite phases flow through, a current path on one side of the differential configuration becomes as shown in FIG. 19A. FIGS. 19A to 19D are equivalent circuit diagrams showing operations of the waveform shaping circuit according to the fourth modification of the embodiment. FIG. 19A shows a current path on the P side of the differential configuration. At this time, mutual induction between the inductive elements L101 and L102 functions, and a coupling coefficient thereof can be set to k1 (0<k1<1). When L101=L102=L, an induced voltage corresponding to (1+k1)L is generated in each of the inductive networks 421 and 421a, and an induced voltage corresponding to an inductance value $L_{A401}=(1+k1)L/2$ is generated in the waveform shaping circuit 402 as a whole.

Alternatively, when the inductive element L101 and the inductive element L102 are disposed so as to weaken the magnetic fluxes when the signal currents of opposite phases flow through, a current path on one side of the differential configuration becomes as shown in FIG. 19C. FIG. 19C shows a current path on the P side of the differential configuration. At this time, the mutual induction between the inductive elements L101 and L102 functions, and the coupling coefficient thereof can be set to k1 (0<k1<1). When L101=L102=L, an induced voltage corresponding to (1−k1)L is generated in each of the inductive networks 421 and 421a, and an induced voltage corresponding to an inductance value $L_{A401}=(1-k1)L/2$ is generated in the waveform shaping circuit 402 as a whole.

As a result, the voltage at the rising edge of the signal Sinp can be raised similarly to the Sout shown in FIG. 4, and the voltage at the falling edge of the signal Sinn can be lowered similarly to the waveform obtained by inverting the phase of the Sout shown in FIG. 4. For example, the signal Sinp can be shaped into the signal Sp in which the rising edge of the signal Sinp is overshot, and the signal Sinn can be shaped into the signal Sn in which the falling edge of the signal Sinn is undershot. The shaped signals are amplified (for example, by about one time) by the buffer circuits 225 and 229 and are output as the signals Soutp and Soutn.

At the timing t2, the first half period $\Delta T1$ of the period $\Delta T$ during which the signal Sinp is at the H level ends, and the second half period $\Delta T2$ of the period $\Delta T$ during which the signal Sinp is at the H level starts. The control signal CK transitions from the H level to the L level, and the control signal CKB transitions from the L level to the H level. At the timing t2, the waveform shaping circuit 402 is switched to the tenth mode (FIG. 18B), the switches SWp1 and SWn1 are turned off and maintained in the off state, and the switches SWp2 and SWn2 are turned on and maintained in the on state.

Accordingly, in each of the inductive networks 421 and 421a, a current flows through the inductive element L103 instead of the inductive element L102 on the N side. Therefore, when the inductive element L101 and the inductive element L103 are disposed so as to strengthen the magnetic fluxes when the signal currents of opposite phases flow through, a current path on one side of the differential configuration becomes as shown in FIG. 19B. FIG. 19B shows a current path on the P side of the differential configuration. At this time, mutual induction between the inductive elements L101 and L103 functions, and a coupling coefficient thereof can be set to k2 (0<k2<1). For example, the coupling coefficient k2 may be smaller than the coupling coefficient k1 (k2<k1). When L101=L103=L, an induced voltage corresponding to (1+k2)L is generated in each of the inductive networks 421, 421a, and an inductance value of the waveform shaping circuit 402 as a whole can be reduced to $L_{A402}=(1+k2)L/2$ (<(1+k1)L/2). As a result, the unwanted ringing of the output signal of the inductive network 121 can be prevented.

Alternatively, in each of the inductive networks 421 and 421a, when the inductive element L101 and the inductive element L103 are disposed so as to weaken the magnetic fluxes when the signal currents of opposite phases flow through, a current path on one side of the differential configuration becomes as shown in FIG. 19D. FIG. 19D shows a current path on the P side of the differential configuration. At this time, the mutual induction between the inductive elements L101 and L103 functions, and the coupling coefficient thereof can be set to k2 (0<k2<1). The coupling coefficient k2 may be larger than, for example, the coupling coefficient k1 (k2>k1). When L101=L103=L, an induced voltage corresponding to (1−k2)L is generated in each of the inductive networks 421, 421a, and an inductance value of the waveform shaping circuit 402 as a whole can be reduced to $L_{A402}=(1-k2)L/2$ (<(1−k1)L/2). As a result, the unwanted ringing of the output signal of the inductive network 421 can be prevented.

At the timing t3 shown in FIG. 4, the first half period ΔT1a of the period ΔTa during which the signal Sinp is at the L level starts. In response to the start of transition of the signal Sinp from the H level to the L level, the control signal CK transitions from the L level to the H level, and the control signal CKB transitions from the H level to the L level. At the timing t3, the waveform shaping circuit 402 is switched to the ninth mode (FIG. 18A), the switches SWp1 and SWn1 are turned on and maintained in the on state, and the switches SWp2 and SWn2 are turned off and maintained in the off state.

Accordingly, in the inductive network 421, a current flows through the inductive element L101 on the P side, and a current flows through the inductive element L102 on the N side. In the inductive network 421a, a current flows through the inductive element L102 on the P side and a current flows through the inductive element L101 on the N side. Therefore, when the inductive element L101 and the inductive element L102 are disposed so as to strengthen the magnetic fluxes when the signal currents of opposite phases flow through, the current path on one side of the differential configuration becomes as shown in FIG. 19A. At this time, the mutual induction between the inductive elements L101 and L102 functions, and the coupling coefficient thereof can be set to k1 (0<k1<1). The induced voltage corresponding to (1+k1)L is generated in each of the inductive networks 421 and 421a, and the induced voltage corresponding to the inductance value $L_{A401}=(1+k1)L/2$ is generated in the waveform shaping circuit 402 as a whole.

Alternatively, when the inductive element L101 and the inductive element L102 are disposed so as to weaken the magnetic fluxes when the signal currents of opposite phases flow through, the current path on one side of the differential configuration becomes as shown in FIG. 19C. At this time, the mutual induction between the inductive elements L101 and L102 functions, and the coupling coefficient thereof can be set to k1 (0<k1<1). The induced voltage corresponding to (1−k1)L is generated in each of the inductive networks 421 and 421a, and the induced voltage corresponding to the inductance value $L_{A401}=(1-k1)L/2$ is generated in the waveform shaping circuit 402 as a whole.

As a result, a voltage at the falling edge of the signal Sinp can be lowered similarly to the Sout shown in FIG. 4, and the voltage at the rising edge of the signal Sinn can be raised similarly to the waveform obtained by inverting the phase of the Sout shown in FIG. 4. For example, the signal Sinp can be shaped into the signal Sp in which the falling edge of the signal Sinp is undershot, and the signal Sinn can be shaped into the signal Sn in which the rising edge of the signal Sinn is overshot. The shaped signals are amplified (for example, by about one time) by the buffer circuits 225 and 229 and are output as the signals Soutp and Soutn.

At the timing t4, the first half period ΔT1a of the period ΔTa during which the signal Sinp is at the L level ends, and the second half period ΔT2a of the period ΔTa during which the signal Sinp is at the L level starts. The control signal CK transitions from the H level to the L level, and the control signal CKB transitions from the L level to the H level. At the timing t4, the waveform shaping circuit 402 is switched to the tenth mode (FIG. 18B), the switches SWp1 and SWn1 are turned off and maintained in the off state, and the switches SWp2 and SWn2 are turned on and maintained in the on state.

Accordingly, in each of the inductive networks 421 and 421a, a current flows through the inductive element L103 instead of the inductive element L102 on the N side. Therefore, when the inductive element L101 and the inductive element L103 are disposed so as to strengthen the magnetic fluxes when the signal currents of opposite phases flow through, the current path on one side of the differential configuration becomes as shown in FIG. 19B. At this time, the mutual induction between the inductive elements L101 and L103 functions, and the coupling coefficient thereof can be set to k2 (0<k2<1). For example, the coupling coefficient k2 may be smaller than the coupling coefficient k1 (k2<k1). In each of the inductive networks 421 and 421a, the induced voltage corresponding to (1+k2)L is generated, and the inductance value of the waveform shaping circuit 402 as a whole can be reduced to $L_{A402}=(1+k2)L/2$ (<(1+k1)L/2). As a result, the unwanted ringing of the output signal of the inductive network 421 can be prevented.

Alternatively, in each of the inductive networks 421 and 421a, when the inductive element L101 and the inductive element L103 are disposed so as to weaken the magnetic fluxes when the signal currents of opposite phases flow through, the current path on one side of the differential configuration becomes as shown in FIG. 19D. At this time, the mutual induction between the inductive elements L101 and L103 functions, and the coupling coefficient thereof can be set to k2 (0<k2<1). The coupling coefficient k2 may be larger than, for example, the coupling coefficient k1 (k2>k1). In each of the inductive networks 421 and 421a, the induced voltage corresponding to (1−k2)L is generated, and the inductance value of the waveform shaping circuit 402 as a whole can be reduced to $L_{A402}=(1-k2)L/2$ (<(1−k1)L/2). As a result, the unwanted ringing of the output signal of the inductive network 421 can be prevented.

At the timings t5 to t8, the operations similar to those at the timings t1 to t4 are performed.

As shown in FIGS. 19A to 19D, each of the buffer circuits 225, 225a, 229, and 229a can be equivalently regarded as a capacitive element C having one end connected to the corresponding line and the other end connected to the ground potential. By configuring the buffer circuits 225, 225a, 229, and 229a to be equivalent to one another, the capacitance values of the equivalent capacitive elements C can be made equal to one another. Since the equivalent buffer circuits 225, 225a, 229, and 229a are disposed on the output side of the inductive networks 421 and 421a, signal amplitudes can be made equal between the ninth mode (FIG. 18A) and the tenth mode (FIG. 18B), and the fluctuation of circuit characteristics and the like due to switching can be prevented.

As described above, in the waveform shaping circuit 402, the inductance value can also be increased at the time of the rising or the falling of the waveform to shape the waveform with a large induced voltage, and the inductance value can also be decreased in the subsequent period to prevent the unwanted ringing, so that the slew rate can be appropriately improved and the jitter characteristics related to the slew rate can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit, comprising:
a waveform shaping circuit configured to receive a signal, operate with a first inductance value in a first period, wherein during the first period, a rising edge or a falling edge of a waveform of the signal is enhanced, and operate with a second inductance value in a second period, wherein during the second period, the rising or falling edges of the waveform is not enhanced,
wherein the first inductance value is greater than the second inductance value,
wherein the waveform shaping circuit includes:
a first inductive element disposed on a first line connected between a first input node and a first output node;
a second inductive element disposed on a second line disposed in parallel with the first line between the first input node and the first output node; and
a first switching element disposed between the first input node and the second inductive element on the second line.

2. The semiconductor integrated circuit according to claim 1, wherein
the waveform shaping circuit includes:
a third inductive element disposed at a position proximate to the first inductive element on a third line, the third line connected between a second input node and a second output node;
a fourth inductive element disposed at a position proximate to the second inductive element on a fourth line, the fourth line connected, in parallel with the third line, between the second input node and the second output node; and
a second switching element disposed between the second input node and the fourth inductive element on the fourth line.

3. The semiconductor integrated circuit according to claim 2, wherein
the waveform shaping circuit includes:
a first buffer circuit disposed between the first inductive element and the first output node on the first line;
a second buffer circuit disposed between the second inductive element and the first output node on the second line;
a third switching element having a first end and a second end, the first end connected to a node between the first inductive element and the first buffer circuit on the first line, the second end connected to a node between the second inductive element and the second buffer circuit on the second line;
a third buffer circuit disposed between the third inductive element and the second output node on the third line;
a fourth buffer circuit disposed between the fourth inductive element and the second output node on the fourth line; and
a fourth switching element having a first end and a second end, the first end connected to a node between the third inductive element and the third buffer circuit on the third line, the second end connected to a node between the fourth inductive element and the fourth buffer circuit on the fourth line.

4. The semiconductor integrated circuit according to claim 1, wherein
the waveform shaping circuit includes:
a third inductive element disposed at a position proximate to the first inductive element on a third line, the third line connected between a second input node and a second output node;
a fourth inductive element disposed at a position proximate to the second inductive element on a fourth line, the fourth line connected, in parallel with the third line, between the second input node and the second output node; and
a second switching element disposed between the second input node and the fourth inductive element on the third line.

5. The semiconductor integrated circuit according to claim 4, wherein
the waveform shaping circuit includes:
a first buffer circuit disposed between the first inductive element and the first output node on the first line;
a second buffer circuit disposed between the second inductive element and the first output node on the second line;
a third switching element having a first end and a second end, the first end connected to a node between the first inductive element and the first buffer circuit on the first line, the second end connected to a node between the second inductive element and the second buffer circuit on the second line;
a third buffer circuit disposed between the third inductive element and the second output node on the third line;
a fourth buffer circuit disposed between the fourth inductive element and the second output node on the fourth line; and
a fourth switching element having a first end and a second end, the first end connected to a node between the third inductive element and the third buffer circuit on the third line, the second end connected to a node between the fourth inductive element and the fourth buffer circuit on the fourth line.

6. The semiconductor integrated circuit according to claim 1, wherein the waveform shaping circuit includes:
a third inductive element disposed at a position proximate to the second inductive element on a third line, the third line connected between a second input node and a second output node;
a fourth inductive element disposed at a position proximate to the first inductive element on a fourth line, the fourth line connected, in parallel with the third line, between the second input node and the second output node; and
a second switching element disposed between the second input node and the fourth inductive element on the fourth line.

7. The semiconductor integrated circuit according to claim 6, wherein
the waveform shaping circuit includes:
a first buffer circuit disposed between the first inductive element and the first output node on the first line;
a second buffer circuit disposed between the second inductive element and the first output node on the second line;
a third switching element connected in parallel with a serial connection of the first switching element and the second inductive element between the first input node and the second buffer circuit on the second line;
a third buffer circuit disposed between the third inductive element and the second output node on the third line;
a fourth buffer circuit disposed between the fourth inductive element and the second output node on the fourth line; and
a fourth switching element connected in parallel with a serial connection of the second switching element and the fourth inductive element between the second input node and the third buffer circuit on the fourth line.

8. The semiconductor integrated circuit according to claim 1, wherein
the waveform shaping circuit includes:
a first buffer circuit disposed between the first inductive element and the first output node on the first line;
a second buffer circuit disposed between the second inductive element and the first output node on the second line; and
a second switching element having a first end and a second end, the first end connected to a node between the first inductive element and the first buffer circuit on the first line, the second end connected to a node between the second inductive element and the second buffer circuit on the second line.

9. The semiconductor integrated circuit according to claim 1, wherein the first switching element includes at least one transistor.

10. A signal processing device, comprising:
the semiconductor integrated circuit according to claim 1; and
a signal processing circuit configured to process a signal that passes through the waveform shaping circuit.

11. The signal processing device according to claim 10, wherein the waveform shaping circuit is configured to process a single phase signal.

12. The signal processing device according to claim 10, further comprising a controller configured to provide control signals to the waveform shaping circuit.

13. The signal processing device according to claim 12, wherein the control signals include a first control signal and a second control signal, the second control signal being complementary to the first control signal.

14. A semiconductor integrated circuit, comprising:
a waveform shaping circuit configured to receive a signal, operate with a first inductance value in a first period, wherein during the first period, a rising edge or a falling edge of a waveform of the signal is enhanced, and operate with a second inductance value in a second period, wherein during the second period, the rising or falling edges of the waveform is not enhanced,
wherein the first inductance value is greater than the second inductance value,
wherein the waveform shaping circuit includes:
a first inductive element disposed on a first line connected between a first input node and a first output node;
a second inductive element disposed between the first inductive element and the first output node on the first line; and
a first switching element disposed between the first input node and the second inductive element on a second line, the second line disposed in parallel with the first line between the first input node and the first output node.

15. A signal processing device, comprising:
the semiconductor integrated circuit according to claim 14; and
a signal processing circuit configured to process a signal that passes through the waveform shaping circuit.

16. The signal processing device according to claim 15, wherein the waveform shaping circuit is configured to process a single phase signal.

17. The signal processing device according to claim 15, further comprising a controller configured to provide control signals to the waveform shaping circuit.

18. The signal processing device according to claim 17, wherein the control signals include a first control signal and a second control signal, the second control signal being complementary to the first control signal.

19. A semiconductor integrated circuit, comprising:
a waveform shaping circuit configured to receive a signal, operate with a first inductance value in a first period, wherein during the first period a waveform of the signal is rising or falling, and operate with a second inductance value in a second period, wherein during the second period the waveform is neither rising nor falling,
wherein the first inductance value is greater than the second inductance value,
wherein
the waveform shaping circuit includes:
a first inductive element disposed on a first line connected between a first input node and a first output node;
a second inductive element disposed on a second line disposed in parallel with the first line between the first input node and the first output node; and
a first switching element disposed between the first input node and the second inductive element on the second line, or
the waveform shaping circuit includes:
a first inductive element disposed on a first line connected between a first input node and a first output node;
a second inductive element disposed between the first inductive element and the first output node on the first line; and
a first switching element disposed between the first input node and the second inductive element on a second line, the second line disposed in parallel with the first line between the first input node and the first output node.

\* \* \* \* \*